(12) United States Patent
Sekiguchi et al.

(10) Patent No.: US 10,116,325 B2
(45) Date of Patent: Oct. 30, 2018

(54) DATA COMPRESSION/DECOMPRESSION DEVICE

(71) Applicant: Clarion Co., Ltd., Saitama-shi, Saitama (JP)

(72) Inventors: Takaaki Sekiguchi, Tokyo (JP); Yasushi Nagai, Tokyo (JP); Tatsuaki Osafune, Tokyo (JP); Ryoichi Fukunaga, Saitama (JP); Takahiro Okubo, Saitama (JP); Taiki Imai, Saitma (JP)

(73) Assignee: Clarion Co., Ltd., Saitama-shi (JP)

( * ) Notice: Subject to any disclaimer, the term of this patent is extended or adjusted under 35 U.S.C. 154(b) by 505 days.

(21) Appl. No.: 14/403,344

(22) PCT Filed: Apr. 18, 2013

(86) PCT No.: PCT/JP2013/061552
§ 371 (c)(1),
(2) Date: Nov. 24, 2014

(87) PCT Pub. No.: WO2013/175909
PCT Pub. Date: Nov. 28, 2013

(65) Prior Publication Data
US 2015/0100556 A1  Apr. 9, 2015

(30) Foreign Application Priority Data
May 25, 2012 (JP) .................. 2012-119180

(51) Int. Cl.
*G06F 17/30* (2006.01)
*H03M 7/30* (2006.01)
(Continued)

(52) U.S. Cl.
CPC ............ *H03M 7/30* (2013.01); *G06F 12/126* (2013.01); *G06F 17/30315* (2013.01);
(Continued)

(58) Field of Classification Search
CPC ................................ G06F 17/30315
See application file for complete search history.

(56) References Cited

U.S. PATENT DOCUMENTS

| | | | |
|---|---|---|---|
| 4,558,302 A | 12/1985 | Welch | |
| 6,275,588 B1 * | 8/2001 | Videcrantz | H03M 7/30 380/255 |

(Continued)

FOREIGN PATENT DOCUMENTS

| | | |
|---|---|---|
| CN | 101841337 A | 9/2010 |
| CN | 102112962 A | 6/2011 |

(Continued)

OTHER PUBLICATIONS

Chinese-language Office Action issued in counterpart Chinese Application No. 201380027389.2 dated Jul. 28, 2016 (Nine (9) pages).

(Continued)

*Primary Examiner* — Syed H Hasan
(74) *Attorney, Agent, or Firm* — Crowell & Moring LLP

(57) ABSTRACT

When compressing an arrangement of fixed-length records in a columnar direction, a data compression device carries out data compression aligned with the performance of a data decompression device by computing a number of rows processed with one columnar compression from the performance on the decompression device side, such as the memory cache capacity of the decompression device or the capacity of a primary storage device which may be used by an application, and the size of one record. Thus, while improving compression ratios of large volumes of data, including an alignment of a plurality of fixed-length records, decompression performance is improved.

17 Claims, 30 Drawing Sheets

(51) Int. Cl.
*H03M 7/40* (2006.01)
*H03M 7/46* (2006.01)
*G06F 12/126* (2016.01)
*G06F 12/0864* (2016.01)
*G06F 12/0871* (2016.01)
*G06F 12/0895* (2016.01)

(52) U.S. Cl.
CPC ............... *H03M 7/40* (2013.01); *H03M 7/46* (2013.01); *G06F 12/0864* (2013.01); *G06F 12/0871* (2013.01); *G06F 12/0895* (2013.01); *G06F 2212/1016* (2013.01); *G06F 2212/401* (2013.01); *G06F 2212/465* (2013.01)

(56) References Cited

U.S. PATENT DOCUMENTS

| | | | | |
|---|---|---|---|---|
| 6,928,451 | B2* | 8/2005 | Mogi | G06F 17/3048 |
| | | | | 707/718 |
| 7,769,729 | B2 | 8/2010 | Faerber et al. | |
| 8,589,451 | B1* | 11/2013 | Zahn | G06F 17/30595 |
| | | | | 707/698 |
| 9,244,935 | B2* | 1/2016 | Barber | G06F 17/30153 |
| 9,384,204 | B2* | 7/2016 | Gupta | G06F 17/30153 |
| 2005/0192994 | A1* | 9/2005 | Caldwell | G06F 17/30286 |
| 2007/0061542 | A1* | 3/2007 | Uppala | G06F 11/1052 |
| | | | | 711/173 |
| 2012/0054225 | A1 | 3/2012 | Marwah et al. | |
| 2012/0109910 | A1 | 5/2012 | Netz et al. | |
| 2012/0143913 | A1* | 6/2012 | Beier | H03M 7/40 |
| | | | | 707/776 |
| 2013/0024433 | A1* | 1/2013 | Amit | H03M 7/30 |
| | | | | 707/693 |
| 2013/0091094 | A1* | 4/2013 | Nelke | G06F 17/30315 |
| | | | | 707/610 |
| 2013/0159265 | A1* | 6/2013 | Peh | G06F 17/30584 |
| | | | | 707/703 |
| 2013/0166557 | A1* | 6/2013 | Fricke | G06F 17/30442 |
| | | | | 707/737 |
| 2013/0166589 | A1* | 6/2013 | Baeumges | G06F 17/30486 |
| | | | | 707/769 |
| 2015/0088813 | A1* | 3/2015 | Lahiri | G06F 17/30292 |
| | | | | 707/609 |

FOREIGN PATENT DOCUMENTS

| | | | |
|---|---|---|---|
| CN | 102521363 A | * | 6/2012 |
| JP | 2001-204001 A | | 7/2001 |
| JP | 2006-276981 A | | 10/2006 |
| JP | 2010-16515 A | | 7/2010 |
| JP | 2011-530234 A | | 12/2011 |

OTHER PUBLICATIONS

International Search Report (PCT/ISA/210) dated Jul. 16, 2013 with English translation (three pages).

Iyer et al. "Data Compression Support in Databases" Proceedings of the VLDB Conference, 1994, pp. 695-704 and four pages of abstract information, Database Technology Institute and University of Southern California; San Jose, CA and Los Angeles, CA.

Extended European Search Report issued in counterpart European Application No. 13794571.3 dated Mar. 15, 2016 (Twelve (12) pages).

* cited by examiner

F I G. 4
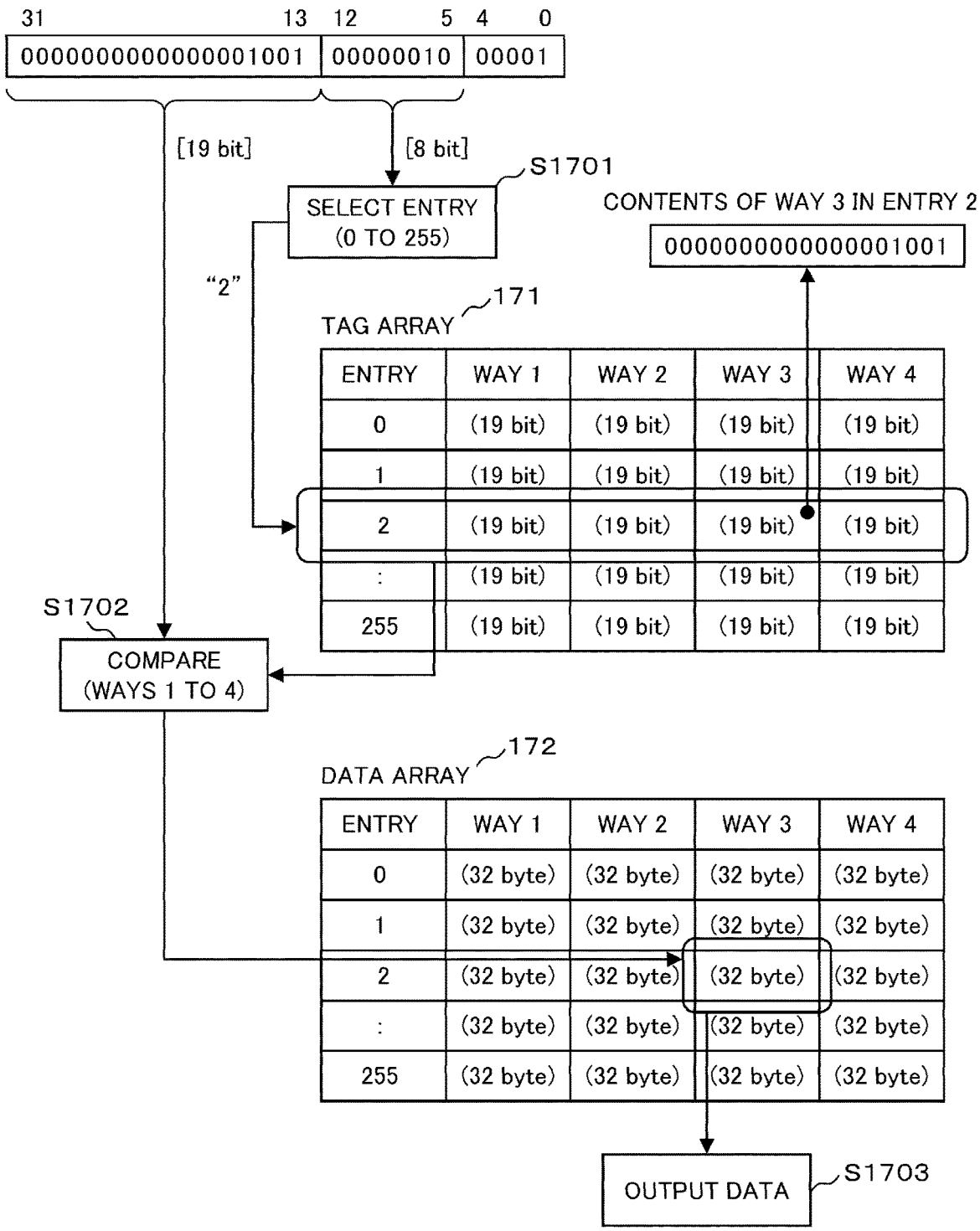

F I G. 5
| #n | : n"th" RECORD (12 bytes) |
▨ : POSITION REFERRED IN COMPRESSION/DECOMPRESSION OF COLUMN 00
| ENTRY | WAY 1 |
|---|---|
| 0 | ▨ #1   ▨ #2   ▨ #3 |
| 1 |    ▨ #4   ▨ #5   ▨#6 |
| 2 |       ▨ #7   ▨ #8 |
| : | : |
| 255 | ▨ #681   ▨ #682   ▨ #683 |
| ENTRY | WAY 2 |
|---|---|
| 0 |    ▨ #684   ▨ #685   ▨#686 |
| 1 |       ▨ #687   ▨ #688 |
| 2 | ▨ #689   ▨ #690   ▨ #691 |
| : | : |
| 255 |    ▨ #1364   ▨ #1365   ▨#1366 |
※ CONTENTS OF WAY 1 IN ENTRY 0 ARE REPLACED IN REFERRING TO COLUMN 00 OF RECORD NO. 1367 AS FOLLOWS
BEFORE REFERRING NO. 1367  ▨ #1   ▨ #2   ▨ #3
AFTER REFERRING NO. 1367  (#1366)  ▨ #1367   ▨ #1368

F I G. 9

| ADDRESS | CONTENTS OF ORIGINAL DATA |
|---|---|
| 0x00000000 | DATA LIST OF ONE RECORD 12 bytes |
| 0x001A0000 | IRREGULAR DATA |
| 0x001B0000 | DATA LIST OF ONE RECORD 8 bytes |
| 0x00300000 | TEXT DATA |
| 0x00310000 | IRREGULAR DATA |
| | : |

| START ADDRESS (701) | COMPRESSION IDENTIFIER (702) | RECORD LENGTH (703) |
|---|---|---|
| 0x00000000 | COLUMNAR COMPRESSION | 12 |
| 0x001A0000 | UNCOMPRESSED | – |
| 0x001B0000 | COLUMNAR COMPRESSION | 8 |
| 0x00300000 | COMPRESSION IN ROW DIRECTION | – |
| 0x00310000 | UNCOMPRESSED | – |
| : | | |

F I G. 1 0
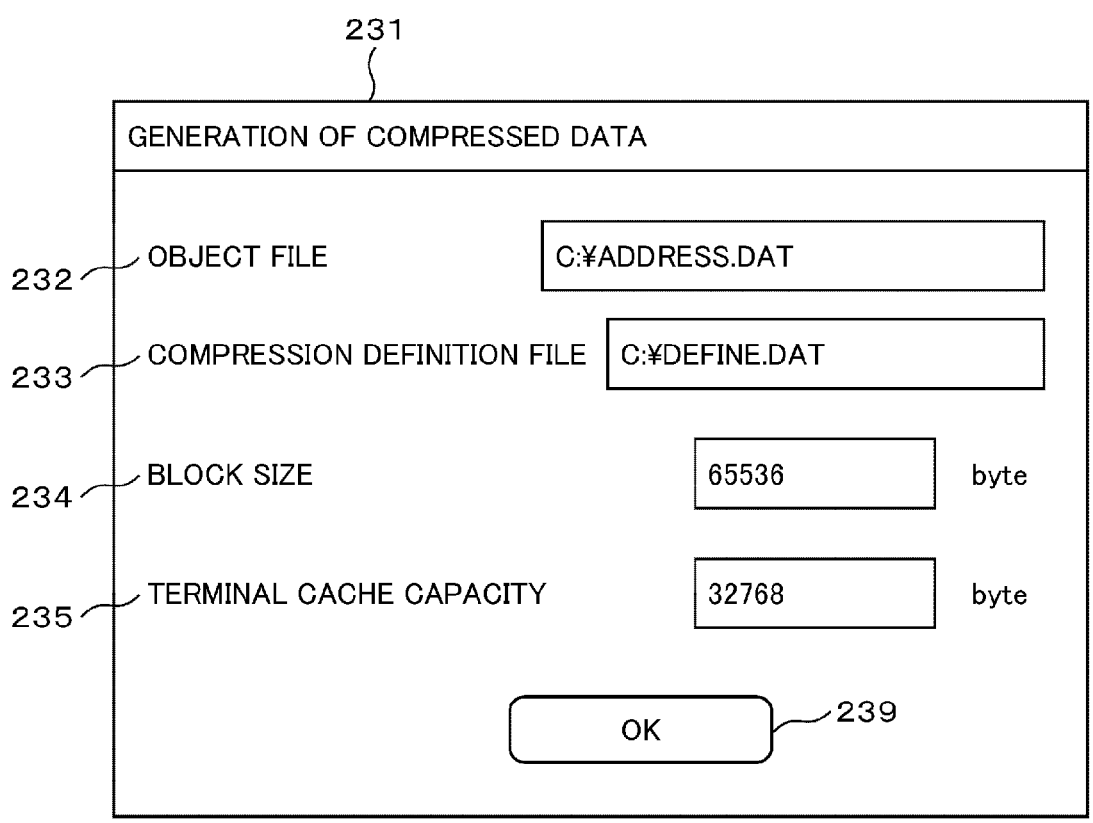

F I G. 1 4
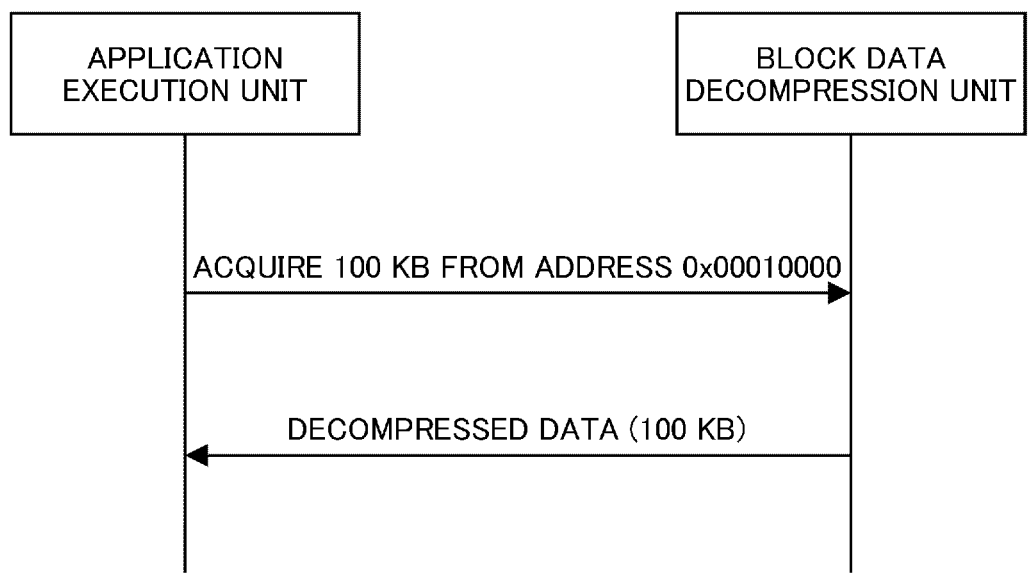

FIG. 18

REFERRED POSITION AFTER COMPRESSED DATA OF COLUMN 00 IS DECOMPRESSED (HEAD OF DATA IN COLUMN 01)

※ CONTENTS OF CASHE ARE NOT REPLACED

| ENTRY | WAY 1 |
|---|---|
| 0 | #1  #2  #3 |
| 1 | #4  #5  #6 |
| 2 | #7  #8 |
| : | : |
| 255 | #681  #682  #683 |

| ENTRY | WAY 2 |
|---|---|
| 0 | #684  #685  #686 |
| 1 | #687  #688 |
| 2 | #689  #690  #691 |
| : | : |
| 255 | #1364  #1365 |

F I G. 2 0
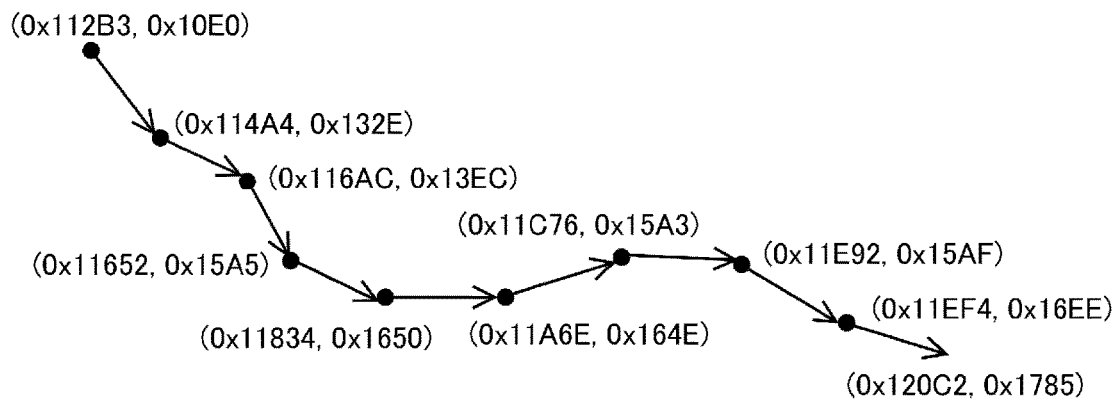

F I G. 2 1
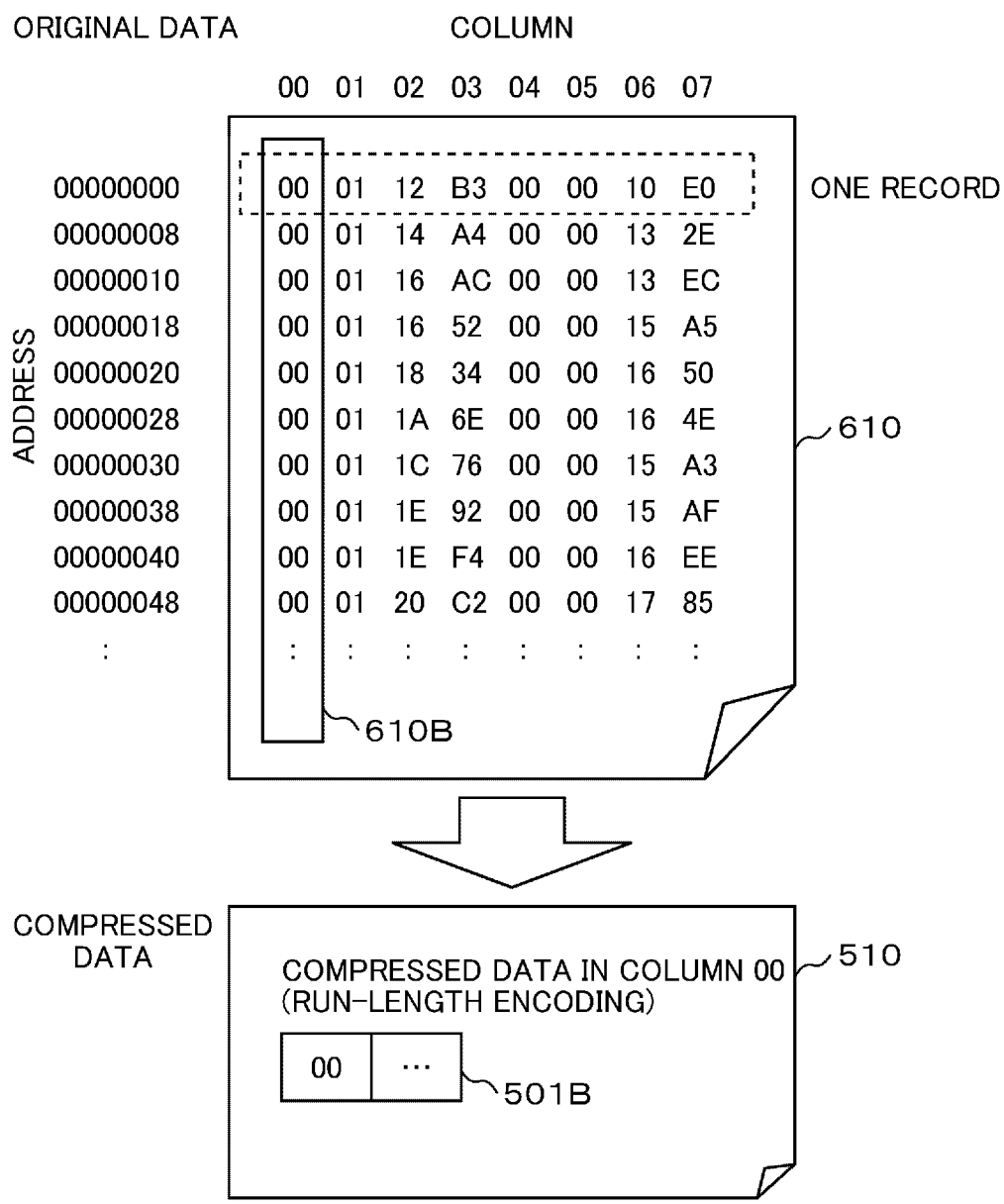

F I G. 2 4
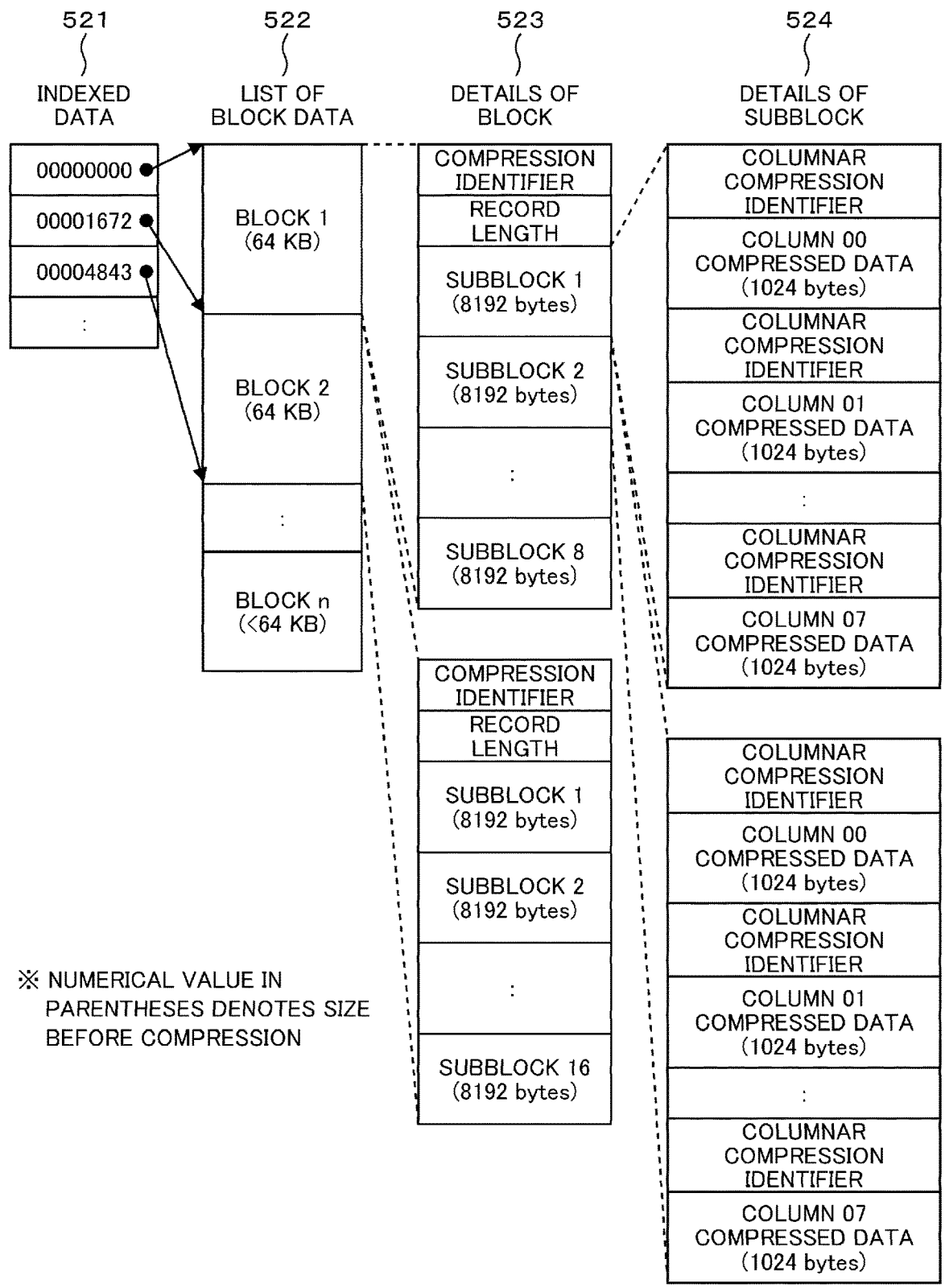

DATA COMPRESSION/DECOMPRESSION DEVICE

TECHNICAL FIELD

A disclosed subject relates to technique for decompressing data acquired by compressing a list of plural fixed-length records at high speed.

BACKGROUND ART

A car navigation system provides transportation guide information to a user by working map data. For a storage medium for map data, many models used a hard disk drive (HDD), however, recently, models using a semiconductor memory such as an SD card and a solid state drive (SSD) are being mainstream.

The semiconductor memory has advantages such as it hardly consumes power and it is excellent in shock resistance, compared with prior HDD, while the semiconductor memory has a defect that a unit price per capacity is high. Therefore, to provide a car navigation system to a user at the similar price to the prior price, the used capacity of the semiconductor memory is required to be reduced. In the meantime, as the contents of data required to operate a car navigation system are unchanged even if HDD or a semiconductor memory is used for a storage medium and besides, the size of a database has a tendency to increase year by year because of a new road and new facilities, technique for reducing the size of data recorded in the car navigation system is continuously desired. For this technique for reducing the size of data, the following techniques are proposed.

First, for a method generally used to reduce data size without changing the contents of data, data compression technique disclosed in Patent Literature 1 can be given. As for data compression techniques, multiple compression methods are proposed in addition to the technique disclosed in the patent literature 1 because data size can be easily reduced and the compression methods are widely actually used.

Besides, for another technique for reducing data size, technique disclosed in Patent Literature 2 can be given. According to this technique, when data has two-dimensional tabular structure, a dictionary is made according to a predetermined procedure based upon each column of a table, the data is compressed in units of column by utilizing the dictionary, and data size is reduced. When the data to be compressed has the two-dimensional structure configured by a row and a column as described above, it is generally known that in the compression of data in units of column, the enhancement of compressibility can be expected more than the simple processing of data (a byte string) in a direction of a row from the head and it is referred in multiple documents such as Non Patent Literature 1.

Moreover, for further another technique for reducing data size, technique disclosed in Patent Literature 3 can be given. According to this technique, from a viewpoint that random access to a specific position in a database and sequential access in referring to relatively voluminous data mix as a mode in which an application of a car navigation system accesses the database, performance in sequential access can be also enhanced by reading the following block in a memory beforehand in referring to a certain block, enabling random access to desired data after data to be compressed is divided in units of predetermined block and is compressed.

CITATION LIST

Patent Literature

Patent Literature 1: U.S. Pat. No. 4,558,302 (15 to 22 pages, FIGS. 2 and 3)
Patent Literature 2: U.S. Pat. No. 7,769,729 B2 (24 to 25 pages, FIG. 10)
Patent Literature 3: Japanese Patent Application Laid-Open No. 2010-165151 (4 to 5 pages, FIG. 2)

Non Patent Literature

Non Patent Literature 1: B. R. Iyer and one other, "Data Compression Support in Databases", In Proceedings of the 20th International Conference on Very Large Data Bases (VLDB94), (United States), 1994, p. 695-704

SUMMARY OF INVENTION

Technical Problem

However, the techniques disclosed in the above-mentioned Patent Literature 1, 2, and 3 have the following problems.

First, in the data compression technique disclosed in Patent Literature 1 and others, a process for restoring compressed data (hereinafter called a decompression process) is required before the reference of data. As this decompression process requires much time, the data compression technique has a problem that when data is simply compressed, performance in various navigation referring to the data is deteriorated.

Besides, in the case of the technique disclosed in Patent Literature 2 and others for compressing data in a columnar direction, compressibility is definitely enhanced, however, as data is compressed in units of column, the technique has a problem in performance that all columns are required to be decompressed to extract data in one line. This problem is an essential problem when data having two-dimensional structure is compressed in a columnar direction, however, the problem is remarkable when the size of a used memory is small especially like the following Patent Literature 3.

According to the technique disclosed in Patent Literature 3, performance in sequential access is enhanced by reading the following block in a cache memory beforehand in referring to data in a certain block, however, this effect can be expected only when contents stored in the cache memory are not replaced on the way of a decompression process. For example, when data is compressed in a columnar direction as in the technique disclosed in Patent Literature 2, all columns are required to be decompressed to extract data in one line as described above and as the size of an area required to hold a result (that is, equivalent to the whole data) of the decompression of all the columns greatly exceeds the capacity of the cache memory, compressed data read beforehand is deleted from the cache memory when a central processing unit (CPU) refers to the area holding the result of the decompression. As a result, the compressed data is read not from the cache memory but from a main storage and a lower-speed storage medium such as HDD again and the effect of reading beforehand cannot be acquired. As described above, the enhancement of performance in decompression, enhancing the compressibility of mass data including a list of multiple fixed-length records is demanded.

Solution to Problem

To settle the above-mentioned problems, this description discloses technique having it as a major characteristic to perform data compression according to the performance of a decompression device by calculating the number of lines to be processed in one columnar compression based upon the capacity and others of a cache memory, an index of performance on the side of the decompression device and the size of one record when a list of plural fixed-length records is compressed in a columnar direction (when data in the same column of plural records are compressed every column). The width of one column will be described as one byte, however, the technique disclosed in this description can be applied even if the width of one column is larger than one byte.

In a disclosed concrete example, in the case of a decompression device provided with a cache memory of 32 KB, when a list of fixed-length records one record of which is 12 bytes is compressed, 16 KB equivalent to a half of 32 KB of the cache memory is used for reading compressed data and 1365 records (=65536÷1) which is the maximum number of records that can be stored in the 16 KB is set as a unit compressed once in a columnar direction. Hereby, unnecessary update of the cache memory when compressed data is decompressed is inhibited and a decompression process can be executed at high speed.

The above-mentioned example is one example and for a method of calculating the number of records compressed once in a columnar direction, in addition to the capacity of the cache memory of the decompression device, the capacity of a main storage which the decompression device can use or one maximum data transmission size according to a communication protocol when the decompression device receives compressed data via a communication network may be also used.

Besides, the technique disclosed in this description has a second characteristic that in a system in which compressed data is distributed to various decompression devices different in an index of performance via a communication network from a distribution server, plural compressed data suitable for the performance of each decompression device are generated beforehand and the compressed data suitable for the performance of the decompression device that makes a request is selected and transmitted. For example, for a terminal for reading data (equivalent to the decompression device disclosed in this description), in addition to a personal computer (PC), various terminals different in performance such as a cellular phone and a smart phone can be given and compressed data the decompression time of which is the shortest can be transmitted to each terminal of these.

Plural compressed data are not generated beforehand, one type of compressed data generated beforehand is once decompressed and the decompressed and restored data may be also recompressed and transmitted according to an index of performance proper to a decompression device that requests compressed data.

For the technique having the above-mentioned characteristics, this description discloses a data compression device based upon a data compression device that compresses data to be compressed including plural fixed-length records and provided with a unit size setting unit that accepts the input of the size of one record of fixed-length records and the specification information of a data decompression device and a columnar data compression unit that determines the size of a block to be compressed based upon the size of the fixed-length record and the specification information of the data decompression device, compresses data in the same column of plural fixed-length records included in each block to be compressed every column, generates compressed columnar data and generates compressed data including each compressed columnar data.

Besides, for a data decompression device that decompresses the compressed data including the plural fixed-length records compressed by the data compression device, this description discloses a data decompression device provided with a columnar data decompression unit that determines the size of a compression object block based upon the size of a fixed-length record and the specification information of the data decompression device, acquires one or more compression object blocks from compressed data, decompresses each compressed columnar data included in the compression object block as a result acquired by compressing the same columnar data of plural fixed-length records every column and restores the plural fixed-length records when the compressed data includes the result acquired by dividing the compression object data in units of predetermined compression object block size and compressing every compression object block and the compression object block size is determined based upon the size of the fixed-length record and the specification information of the data decompression device.

Advantageous Effects of Invention

According to the disclosed contents, the performance of decompression can be enhanced, enhancing the compressibility of mass data including a list of multiple fixed-length records.

BRIEF DESCRIPTION OF DRAWINGS

FIG. 4 is an explanatory drawing for explaining the structure of a cache memory 170 (Example 1);

FIG. 5 is an explanatory drawing for explaining a problem of the cache memory in compression in a columnar direction (Example 1);

FIG. 9 shows the configuration of a compression definition file (Example 1);

FIG. 10 shows a compressed data generation screen (Example 1);

FIG. 14 is an explanatory drawing for explaining a request from application software (Example 1);

FIG. 18 shows a state of the cache memory 170 (Example 1);

FIG. 20 shows the structure of one record of running history data (Example 2);

FIG. 21 shows data (original data) to be compressed (Example 2);

FIG. 24 shows the configuration of compressed data (for a cache of 16 KB)(Example 2);

DESCRIPTION OF EMBODIMENTS

Example 1

Referring to FIGS. 1 to 18, a tree data compression system equivalent to Example 1 will be described below.

In Example 1, retrieval data (hereinafter called tree data) that occupy multiple areas in a database stored in a car navigation system are compressed so as to reduce the size of the database in the car navigation system. In Example 1, a columnar data decompression device 100 is equivalent to the car navigation system and a columnar data compression device 200 is equivalent to a device such as a personal computer for generating data stored in a storage medium 150 of the car navigation system.

Figure 1:
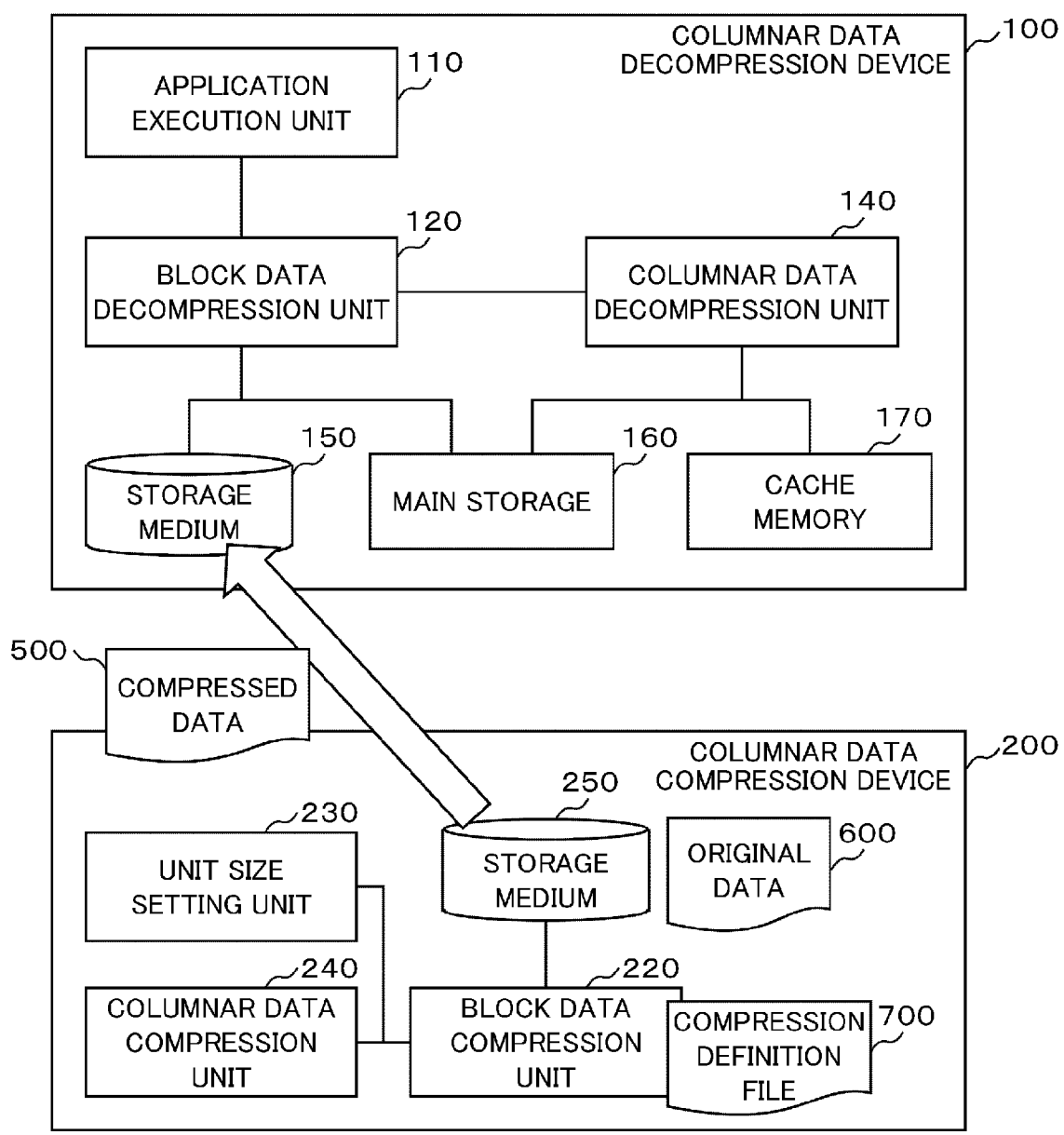
FIG. 1 shows the whole configuration of a tree data compression system (Example 1)

FIG. 1 shows the functional configuration of the tree data compression system equivalent to Example 1. This system roughly includes the columnar data decompression device 100 and the columnar data compression device 200. Tree data to be compressed in Example 1 is compressed in the columnar data compression device 200 and is copied in the storage medium 150 of the columnar data decompression device 100. In the columnar data decompression device 100, application software executes a retrieval process, partially decompressing compressed tree data.

The columnar data decompression device 100 includes an application execution unit 110 that executes application software, a block data decompression unit 120 that decompresses data compressed in units of block, a columnar data decompression unit 140 that decompresses data compressed in a columnar direction, the storage medium 150 that stores compressed data 500, a main storage 160 and a cache memory 170.

The columnar data compression device 200 includes a block data compression unit 220 that compresses data in units of block, referring to a compression definition file 700, a unit size setting unit 230 that sets a parameter for compressing data, a columnar data compression unit 240 that compresses data in a columnar direction and a storage medium 250 that stores original data 600 which is an object of compression and the compressed data 500. Though the followings are not shown because they are not directly related to Example 1, a main storage and a cache memory respectively for executing a series of processing also exist in the columnar data compression device 200 as in the columnar data decompression device 100.

Each device shown in FIG. 1 can be realized using a general computer provided with CPU and a storage. In this embodiment, the cache memory 170 is provided inside the CPU, the main storage 160 is made of a semiconductor memory, and the storage medium 150 is made of a magnetic record medium such as HDD or a lower-speed and nonvolatile flash memory than the main storage 160.

Further, respective processing units that configure each device are embodied in the above-mentioned computer when the CPU executes programs stored in the main storage 160 and the storage medium 150. Each program may be also stored in the storage in the computer beforehand and may be also installed in the storage from another device via an input/output interface and a medium which the computer can use if necessary. The above-mentioned medium denotes a storage medium which can be inserted/extracted into/from the I/O interface or a communication medium (that is, a wired, radio or optical network or a carrier and a digital signal propagated in the network) for example.

Figure 2:
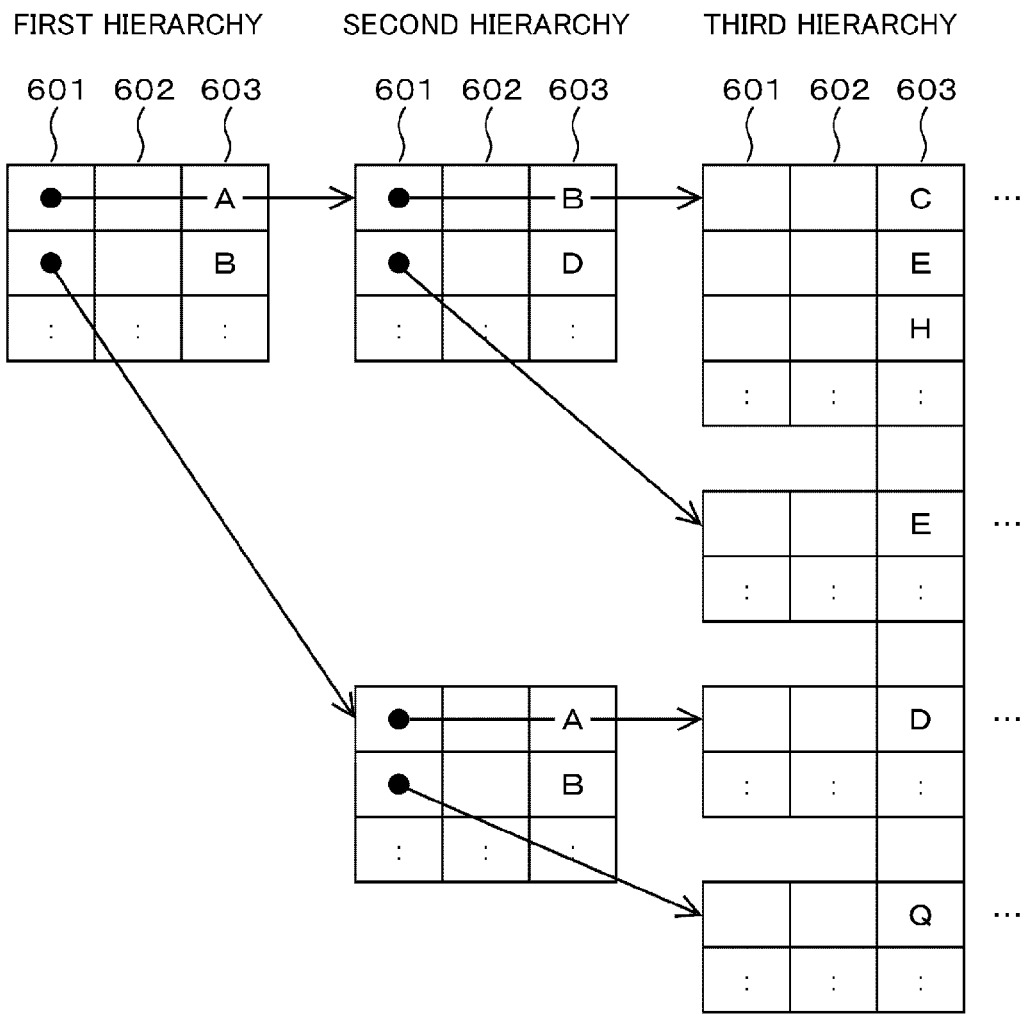
FIG. 2 shows the structure of one record of tree data (Example 1)

FIG. 2 shows an example of a format of tree data to be compressed and an example of the tree data. One record of the tree data is configured by 12 bytes and stores an address 601 (4 bytes) of a low order node (a child of a tree), the size 602 (4 bytes) of the low order node and a value 603 (4 bytes) of the record. The example of the data shown in FIG. 2 means that when a first character is "A" for example, following second characters are "B" and "D" and for a third character following "B", "C", "E" and "H" exist.

Such tree data is used on a screen (on which buttons showing each character such as alphanumeric characters are displayed) provided to a general car navigation system for inputting a name of a destination and others, when "A" is input, such control that though a button of a second character (that is, "B", "D" and others) of a name that starts with "A" can be pressed, the other character cannot be pressed is made, and the tree data is data for facilitating retrieval by a user.

Figure 3:
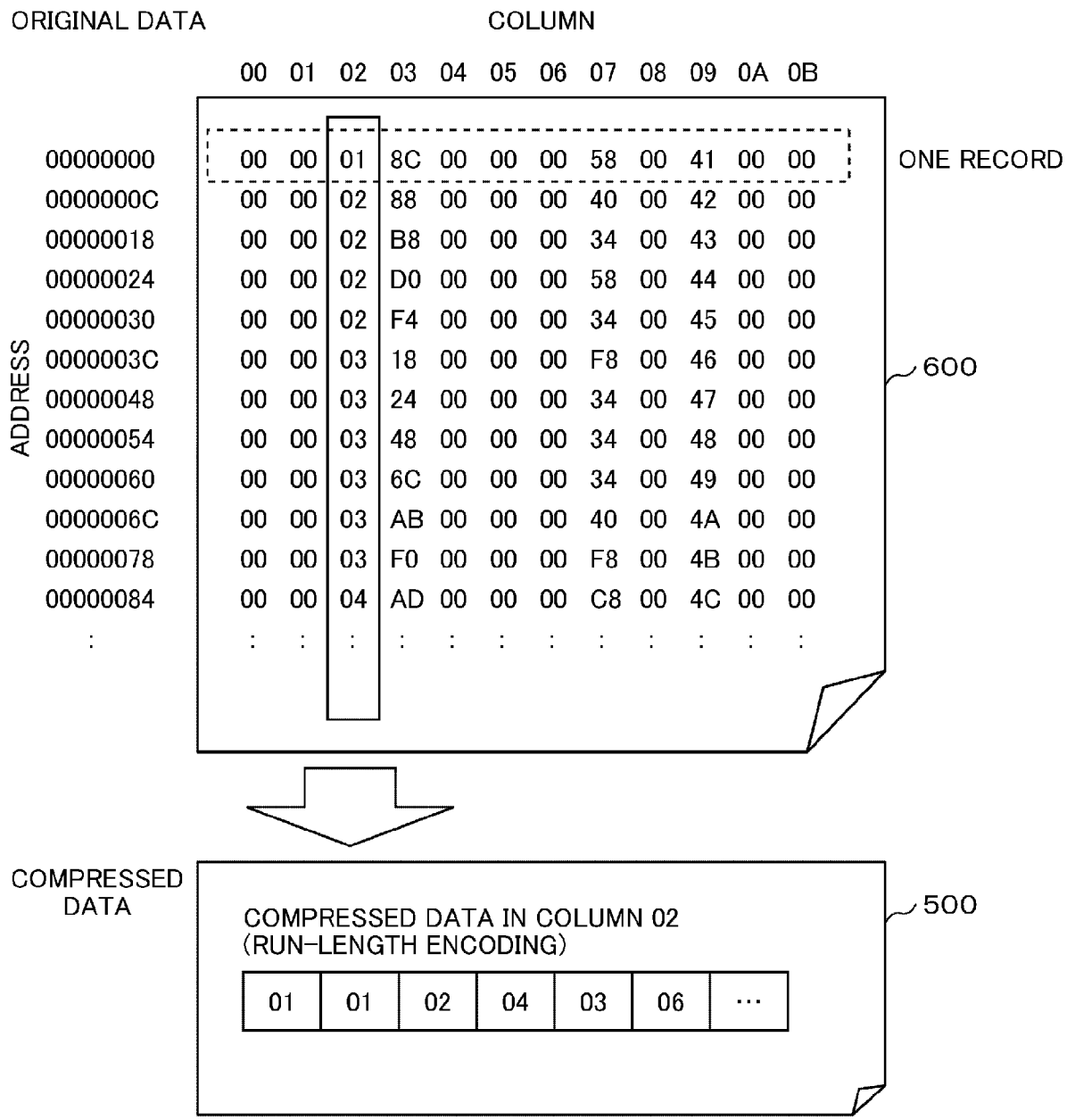
FIG. 3 shows data (original data) to be compressed (Example 1)

FIG. 3 shows an example in which an array of tree data included in the original data 600 is represented with hexadecimal numbers and an example of compressed data in a column 02 included in the compressed data 500. In the example of the tree data, to make understanding easy, the compressed data is represented in units of 12 bytes which is the size of one record. When the data is configured by the array of fixed-length records as described above, values in the same digits often have a characteristic pattern and for example, values in columns 00 and 01 are all "00". As for a column 02, the same plural values continue and when these are compressed using a run length code, the data is represented as 01, 01, 02, 04, 03, 06. This compressed data means that a symbol 01 continues by 1, a symbol 02 continues by 4 and a symbol 03 continues by 6. The run length code is a compression method of representing data using symbols and a number by which the symbol continues and is disclosed in multiple documents.

Besides, in a column 08 and a column 09, a character corresponding to each node of the tree data is stored in a format of UNICODE (UTF16) in which one character occupies two bytes, "0041" in a first record corresponds to a letter "A", and "0042" in a second record corresponds to a letter "B". When only alphanumeric characters are used, "00" is all stored in the column 08 (the upper order byte) in the UTF16.

FIGS. 2 and 3 show the examples of retrieval data having names made of alphanumeric characters, however, this embodiment is not limited to a case that alphanumeric characters are used, and this embodiment can be also applied to characters of Japanese, German, French and others languages.

Next, to help to understand a background of this embodiment, problems when data is compressed in a columnar direction will be described referring to FIGS. 4 and 5.

FIG. 4 shows an example of a cache memory 170 based upon a method called set associative generally used recently. Generally, a cache memory 170 includes plural areas (called entry) that stores data in fixed size (called a line) and especially, the set associative method is a method of storing plural lines in the same entry using a tag. The number of lines which can be stored in the same entry is called the number of ways and a case that four lines can be stored in the same entry is called a 4-way set associative method.

FIG. 4 shows the example of the 4-way set associative method in which one line size is 32 bytes and which has 256 entries and shows a case of the method using 8 bits corresponding to fifth to twelfth bits in a virtual address for an index of entry and using 19 bits corresponding to thirteenth to thirty-first bits in the address for a tag. In the example shown in FIG. 4, a tag array 171 and a data array 172 respectively having columns of the number of ways (that is, four) are shown. The data array 172 is a table that holds four lines stored in each entry and the tag array 171 stores each tag showing in which address in each entry data stored in the data array 172 is stored.

Next, the operation of the cache memory 170 will be described using a case that reference to data located in the virtual address (32 bits) 0x00012041 occurs for an example. First, an entry is determined based upon a value of 8 bits corresponding to the fifth to twelfth bits in the virtual address (step S1701). The value stored in the fifth to twelfth bits is 00000010 in binary notation, that is, 2 which is a decimal number and means that data is stored in the entry 2 when the data is located in the cache memory 170.

Next, the 19 bits (the tag) corresponding to the thirteenth to thirty-first bits in the virtual address is compared with four tags included in the entry 2 of the tag array 171 (step S1702). In the case of the example, the same tag is stored in a way 3 of the entry 2 and from this, it is identified that data of a line including the virtual address 0x00012041 is held in the way 3 of the entry 2. This state is a so-called state in which the cache is hit and processing can be completed with output from the high-speed cache memory 170 without access to the main storage 160 by the CPU (step S1703).

In the meantime, a case that no tag which is coincident with the virtual address is found as a result of reference to the tag array 171 is a so-called cache mishit and data is read from the main storage 160. In this case, for a generally used method, a line recently least referred out of four lines included in the entry 2 is deleted from the cache memory 170 according to a least recently used (LRU) method and a line newly read from the main storage 160 is stored in that location. When such replacement of lines frequently occurs, access performance to data by the CPU is remarkably deteriorated.

FIG. 5 shows an example of the problem in a case that a list of fixed-length records one of which is configured by 12 bytes is referred in a columnar direction in the cache memory 170 shown in FIG. 4. A rectangle including "#n" means one record (12 bytes) and "n" denotes the order of reference of the record. A black rectangle shows a location of the column 00 (1 byte) and is located at the head of each record. In FIG. 5, contents held in a way 1 and a way 2 when a 1366"th" record is referred are shown. For example, in the entry 0 of the way 1, a record #1 (12 bytes), a record #2 (12 bytes) and 8 bytes at the head of a record #3 are stored. In the next entry 1, 4 bytes which is the continuation of the record #3, a record #4 (12 bytes), a record #5 (12 bytes) and 4 bytes at the head of a record #6 are stored. In the following entries, following records are also similarly stored.

When the number of ways which can be used for holding the original data out of 4 ways that configure the cache memory 170 is 2, a cache mishit occurs when the column 00 of a record #1367 is referred and the way 1 of the entry 0 is replaced with data including the column 00 of the record #1367 by LRU. Similarly, data in the following each entry is also sequentially replaced. Afterward, when processing for referring to the column 00 of each record is finished and processing for referring to the column 01 is started, the record #1 is read in the cache memory 170 again. That is, as for the record #1, after the column 00 (1 byte) is processed, remaining 11 bytes of 12 bytes are deleted from the cache memory 170 without being referred, next, in the processing of the column 01, remaining 10 bytes are also deleted from the cache memory 170 without being referred, and efficiency in the utilization of the cache is remarkably bad.

As four ways are provided, the way 3 and a way 4 are also actually used, however, as CPU also refers to compressed data before decompression and data in a work area used by compression/decompression algorithm in addition to decompressed each record, all ways cannot be used for only holding decompressed each record. Besides, even if all ways can be used, the number of stored records is at most turned double and the problem is essentially not settled.

In view of the above-mentioned problems, the details of Example 1 will be described below.

Figure 6:
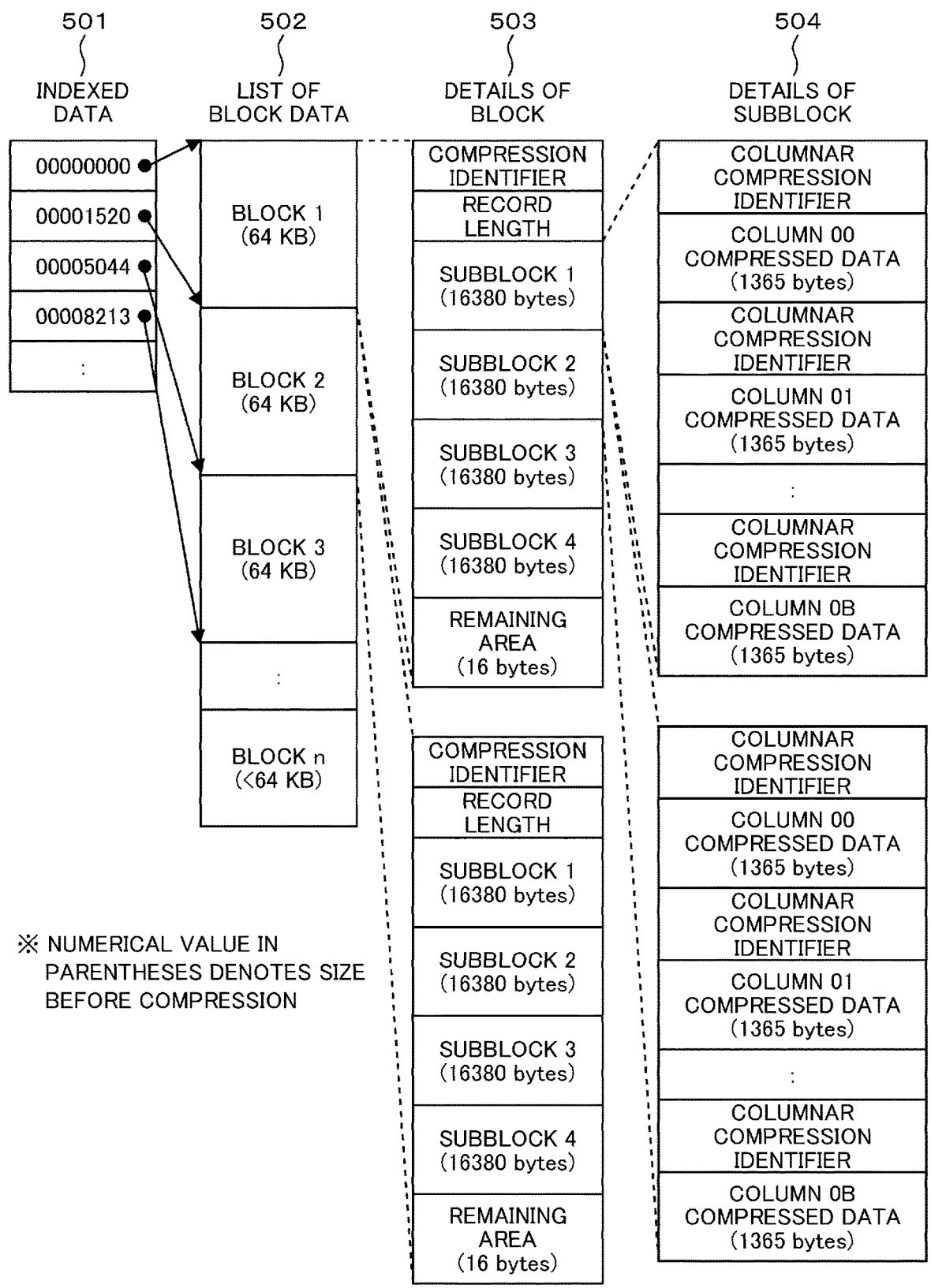
FIG. 6 shows the configuration of compressed data (Example 1)

FIG. 6 shows a format of the compressed data 500 in Example 1 (a numeric value in parentheses denotes size before compression). The compressed data 500 is acquired by dividing the original data into blocks of predetermined size (64 KB in FIG. 6) and compressing, and includes index data 501 showing a start address of each block and a list of block data 502 which is a list of each compression object block.

In details 503 of the block, compression object data included in each block are described and the details are configured by a compression identifier, record length, a list of subblocks and remaining data. The subblock is a compression object block acquired by dividing the block in subblock size in which no above-mentioned problem occurs, the subblock is data acquired by compressing a compression object block acquired by dividing each block every 16380 bytes (size equivalent to 1365 records) in FIG. 6, and remaining data means remaining data (16 bytes in this case) which is aliquant in the subblock size (16380 bytes in this case).

In the details 504 of the subblock, data included in each subblock are described and the details include plural columnar compression identifiers and plural columnar compressed data. For example, compressed data in the column 00 is acquired by compressing values in the column 00 of the 1365 records and the size of the original data is 1365 bytes.

Figure 7:
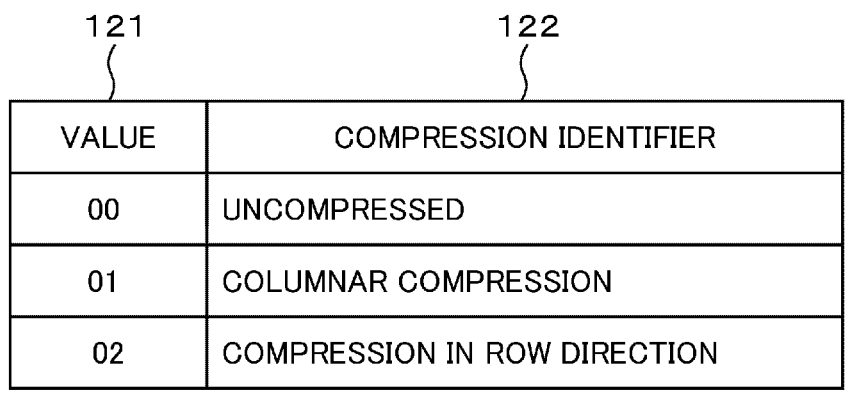
FIG. 7 shows the configuration of a compression identifier (Example 1)

FIG. 7 shows values of the compression identifiers 122 included in the details 503 of the block. The compression identifier 122 shows a method when each block is compressed and in fields of the compression identifier, "00" (uncompressed), "01" (columnar compression) and "02" (compression in a row direction) are defined. "00" (uncompressed) is an identifier used when data included in a compression object block has no regularity and size reduction effect is not acquired even if the data is compressed, "01" (columnar compression) is an identifier used when size reduction effect is acquired in columnar compression, and "02" (compression in the row direction) is an identifier used when size reduction effect is acquired in a case that data is normally processed in the row direction, that is, from the head by one byte.

Figure 8:
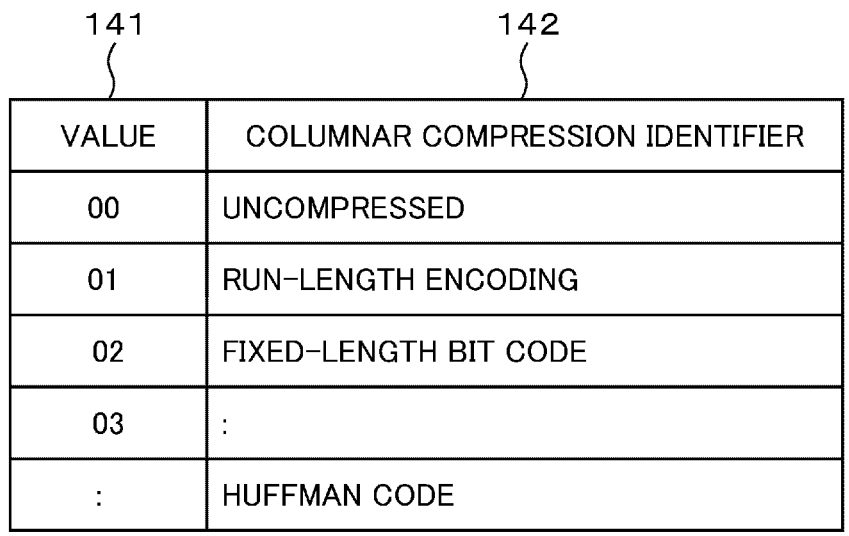
FIG. 8 shows the configuration of a columnar compression identifier (Example 1)

FIG. 8 shows values of the columnar compression identifiers 142 included in the details 504 of the subblock. The columnar compression identifier 142 shows a method when each column which is an object of compression is compressed and in fields of the columnar compression identifier, "00" (uncompressed), "01" (run-length encoding), "02" (a fixed-length bit code), "03" (Huffman code) and others are defined. "00" (uncompressed) is an identifier used when data included in the column which is an object of compression has no regularity and no size reduction effect is acquired even if the data is compressed and "01" (run-length encoding) is an identifier used when size reduction effect is acquired by compressing data included in the column which is the object of compression according to run-length encoding. "02" (the fixed-length bit code) and "03" (Huffman code) are also similarly identifiers used when size reduction effect is acquired according to respective methods.

The fixed-length bit code is a method of reducing data size by replacing with a code of 4 bits which can represent 16 symbols and outputting it in case that at most only the 16 symbols exist in the original data when a symbol of 8 bits is compressed for example. Besides, Huffman code is a method of reducing data size by calculating the probability of the appearance of symbols and outputting a minimum redundant code. Example 1 selects a compression method having the greatest size reduction effect and uses it in compressing each column, and as it is supposed that generally used technique is utilized as it is, the details of each compression method are not particularly described.

FIG. 9 shows the compression definition file 700 referred when the block data compression unit 220 compresses data. In the compression definition file 700, a start address 701, a compression identifier 702 and record length 703 are described. Generally, in a database of a car navigation system, data included in one file are rarely a list of fixed-length records having the same size and in addition to a list of fixed-length records, data having no regularity and data unsuitable for columnar compression such as normal text data are also included. FIG. 9 shows a situation that from an address 0x00000000, a list of fixed-length records one of which is configured by 12 bytes is stored, similarly, at an address 0x001A0000, data having no regularity is stored, from an address 0x001B0000, a list of fixed-length records one of which is configured by 8 bytes is stored, at an address 0x00300000, text data is stored and at an address 0x00310000, data having no regularity is stored. The compression definition file is used to determine a compression method applied to each block when the block data compression unit 220 compresses data based upon this storage situation.

Example 1 will be described below according to a flow of a process when the tree data is stored in a car navigation system with the tree data compressed and the compressed tree data is referred in the car navigation system.

FIG. 10 shows a unit size setting screen 231 displayed by the unit size setting unit 230 when the tree data is compressed using the columnar data compression device 200. On the unit size setting screen 231, fields for inputting an object file 232, a compression definition file 233, block size 234 and terminal cache capacity 235 exist. The object file 232 is the field for inputting a location in which the original data 600 is located in the storage medium 250, the compression definition file 233 is the field for inputting a location in which the compression definition file 700 is located in the storage medium 250, the block size 234 is the field for inputting the size of each block shown in FIG. 6 (size before compression), and the terminal cache capacity 235 is the field for inputting the capacity of the cache memory 170 with which the columnar data decompression device 100 is provided. The compression process is started by inputting these parameters and pressing an OK button 239.

Figure 11:
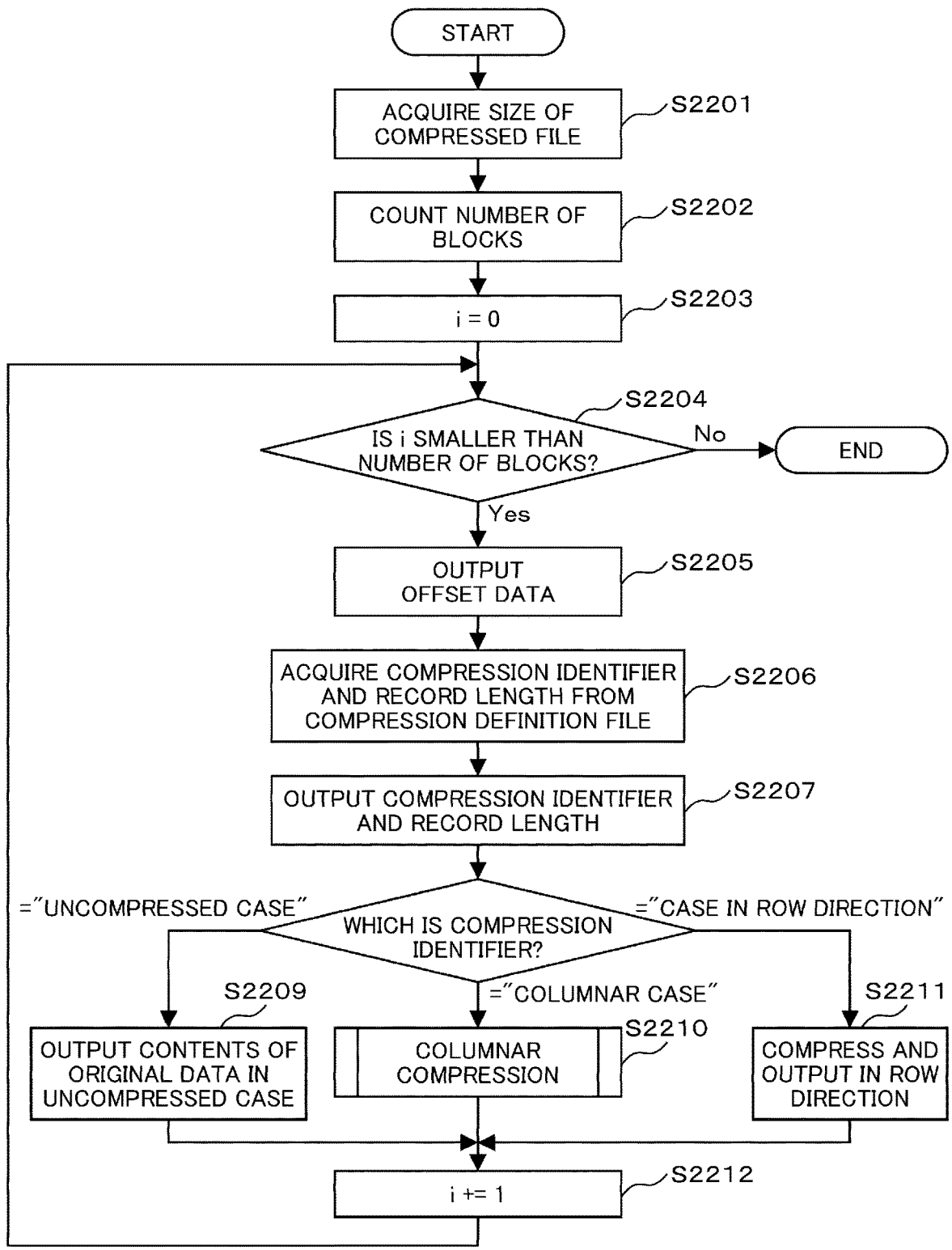
FIG. 11 is a flowchart showing the operation of a block data compression unit (Example 1)

FIG. 11 is a flowchart showing the operation of the block data compression unit 220 after the OK button 239 is pressed. The block data compression unit 220 first acquires the size of a file (original data) input to the field of the object file 232 (step S2201).

Next, the number of blocks included in the original data is calculated based upon block size input to the field of the block size 234 (step S2202). For example, when the size of the original data is 67588096 bytes and the block size is 64 KB (65536 bytes), the number of blocks is a value (numbers below a decimal point are rounded up) acquired by dividing 67588096 by 65536 and the value is 1032. The size of a 1032"th" block is 20480 bytes which cannot be divided by 65536.

Next, a variable "i" of a counter in a loop process repeated every block is initialized to zero (step S2203).

Next, it is determined whether the variable i is below the number of the blocks acquired in the step S2202 or not (step S2204). When the variable i is below the number of the blocks, a start address (offset data) of the block during processing in the list of block data 502 is output to a field of the index data 501 (step S2205).

Next, a compression identifier and record length respectively used when the block during processing is compressed are acquired referring to the compression definition file 700 (step S2206). This step is performed by scanning each line of the compression definition file and acquiring the compression identifier and the record length respectively corresponding to an address of the block during processing.

Next, the acquired compression identifier and record length are output to a field of the list of block data 502 (step S2207).

Next, processing is branched according to the compression identifier (step S2208). When the compression identifier is 00 (uncompressed), contents (64 KB in the cases of the block 1 to the block 1031, 20480 bytes in the case of the block 1032) of the original data are output to the list of block data 502 as it is (step S2209). When the compression identifier is 01 (columnar compression), columnar compression is made (step S2210). The details of columnar compression will be described later. When the compression identifier is 02 (compression in the row direction), the original data is compressed in a row direction using well-known compression algorithm such as zlib and compressed data is output to the list of block data 502 (step S2211). After any of the above-mentioned three steps is completed, the variable i of the counter is incremented by 1 and processing is returned to the step S2204 (step S2212). The processing in the above-mentioned steps S2204 to S2212 is repeated for all blocks, when the variable i is equal to the number of blocks in the step S2204, the compression processing of data is finished, and the compressed data 500 is stored in the storage medium 250.

Figure 12:
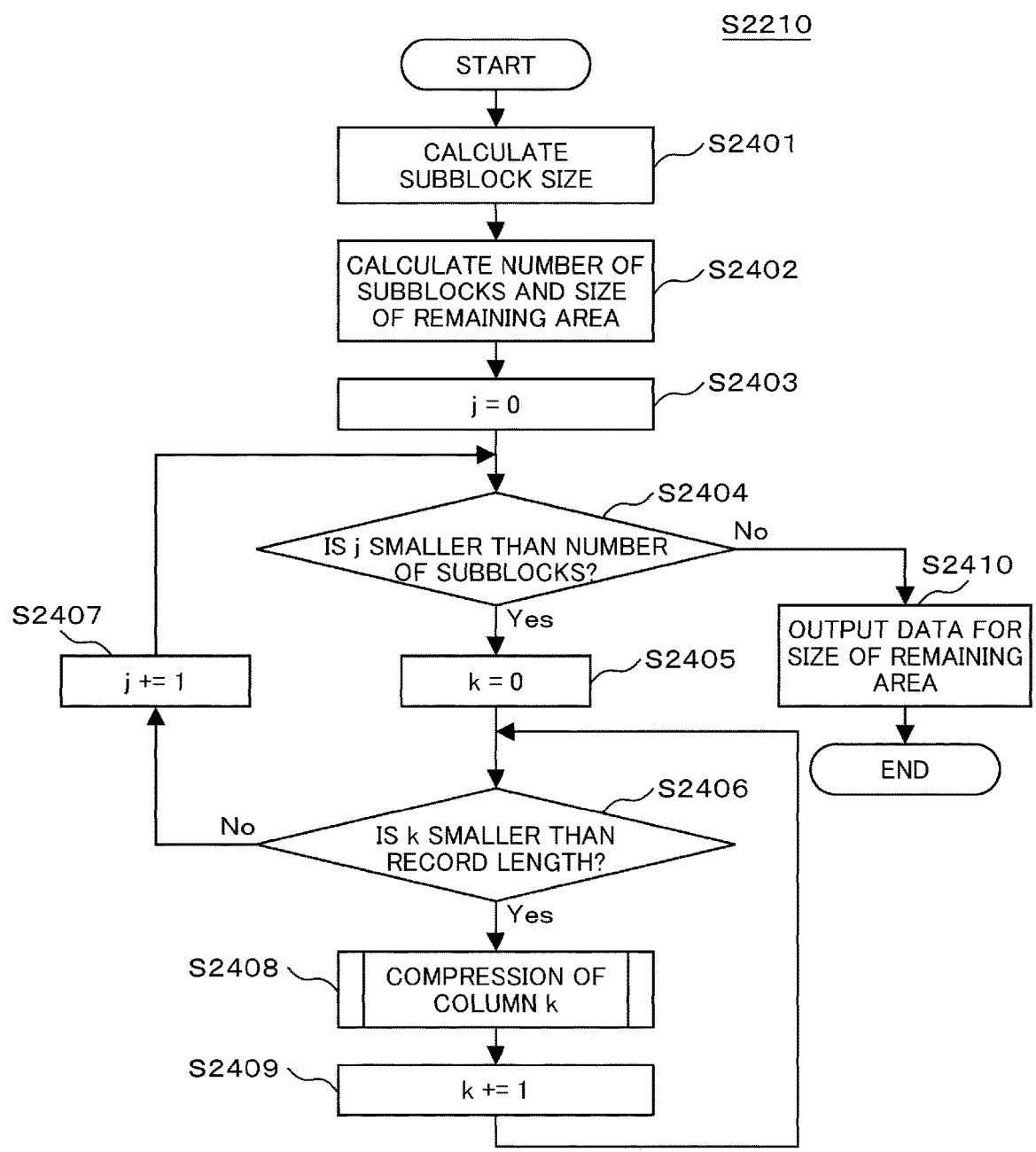
FIG. 12 is a flowchart showing the operation of a columnar data compression unit (Example 1)

FIG. 12 is a flowchart showing the operation of the columnar data compression unit 240 executed in the step S2210 shown in FIG. 11. The columnar data compression unit 240 first calculates subblock size based upon cache memory capacity input to a field of the terminal cache capacity 235 and the record length acquired from the compression definition file (step S2401). For example, assuming that a half (16 KB) of 32 KB can be used for holding data after decompression when the capacity of the cache memory is 32 KB and the size of one record is 12 bytes, the size of the maximum number of records which can be stored in 16 KB is equivalent to subblock size. That is, division of the 16 KB is done at 12 bytes, and the value of 16380 bytes which multiplied 12 bytes of divisor to the quotient 1365 configure subblock size.

Next, the number of subblocks and the size of a remaining area are calculated based upon block size input to a field of the block size 234 and the subblock size acquired in the step S2401 (step S2402). As the block size is 65536 bytes and the subblock size is 16380 bytes, the number of subblocks is 4 and the size of the remaining area is 16 bytes.

Next, a variable "j" of the counter in a loop process repeated every subblock is initialized to zero (step S2403).

Next, it is determined whether the variable j is below the number of subblocks or not (step S2404). When the variable j is below the number of subblocks, a variable "k" of the counter in a loop process repeated for each digit of the record is initialized to zero (step S2405).

Next, it is determined whether the variable k is below record length or not (step S2406). When the variable k is below record length, a column k is compressed (step S2408). The compression of the column k will be described later.

Next, the variable k of the counter is incremented by 1 and processing is returned to the step S2406 (step S2409).

The processing in the above-mentioned steps S2406 to S2409 is repeated for all columns and when the variable k becomes equal to record length in the step S2406, the variable j of the counter is incremented by 1 and processing is returned to the step S2404 (step S2407).

When the above-mentioned processing is repeated for each subblock and the variable j becomes equal to the number of subblocks in the step S2404, remaining input data (that is, data for the size of the remaining area calculated in the step S2402) is output to the list of block data 502 as it is and the columnar data compression process is finished (step S2410).

Figure 13:
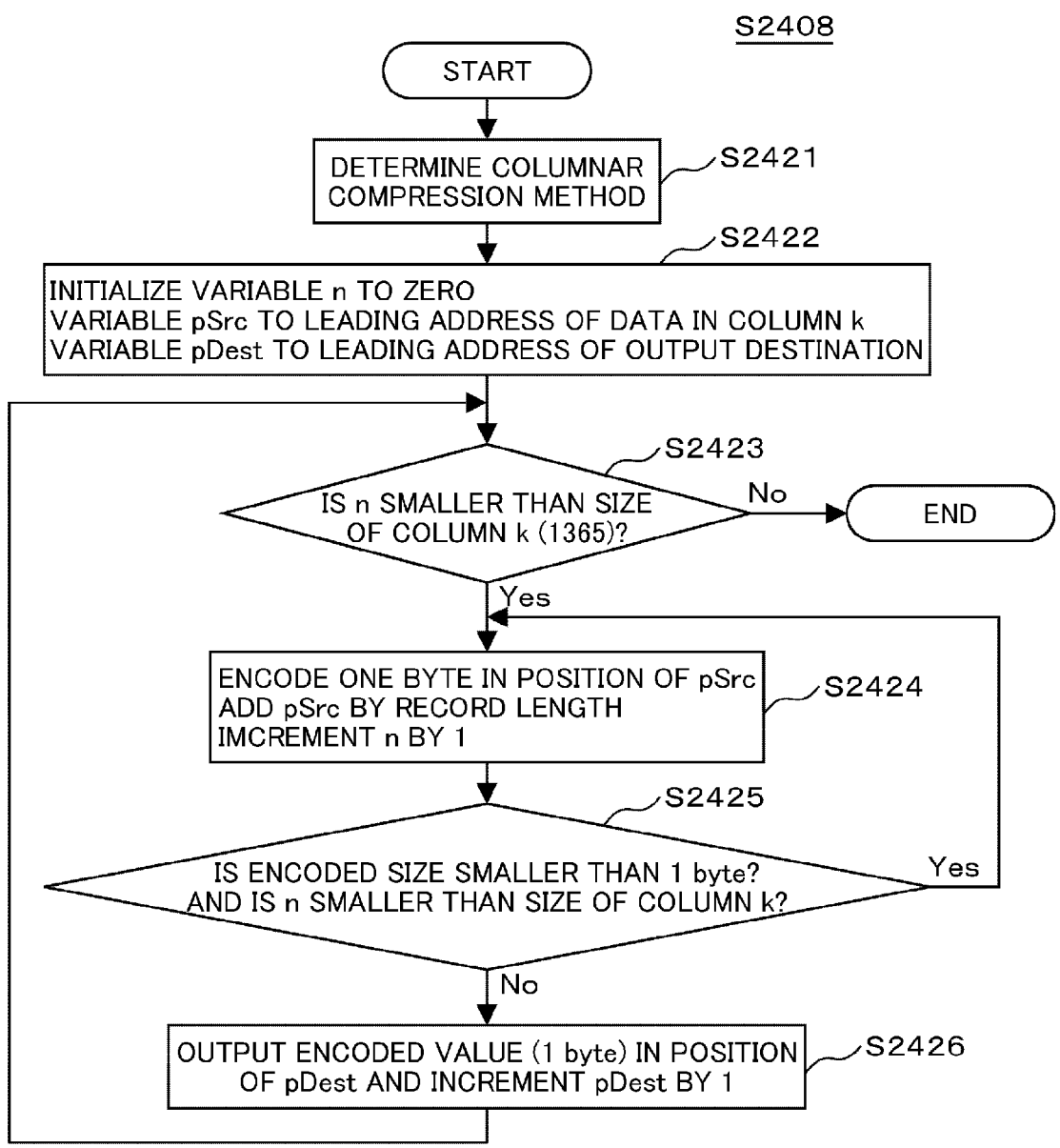
FIG. 13 is a flowchart showing the operation of a columnar compression process (Example 1)

FIG. 13 is a flowchart showing a compression process of the column k executed in the step S2408 shown in FIG. 12. First, a columnar compression identifier used for the compression of the column k is determined (step S2421). This processing is performed by calculating using which method out of 00 (uncompressed), 01 (run-length encoding), 02 (the fixed-length bit code) and 03 (static Huffman code), size after compression is the smallest by counting a frequency of the appearance of symbols included in the column k.

Next, variables n, pSrc, pDest used for the compression process are initialized (step S2422). The variable "n" denotes processed input data size (the number of bytes) and is initialized to zero. The variable pSrc denotes an address of original data and is initialized to a leading address of data in the column k. The variable pDest is initialized to an address of an output destination of compressed data. Next, it is determined whether the variable n is below the size of the column k (that is, 1365) or not (step S2423). When the variable n is below the size of the column k, one byte that exists at an address shown by the variable pSrc is encoded according to a method which the columnar compression identifier shows, the variable pSrc is added by record length, and the variable n is incremented by 1 (step S2424). When an encoded result is below 1 byte and the variable n is below the size of the column k, processing is returned to the step S2424. When the encoded result is 1 byte or the variable n is equal to the size of the column k, processing proceeds to a step S2426 (step S2425).

When a symbol of 1 byte or more shown by pSrc is encoded to be 1 byte, the encoded value (1 byte) is output to an address which pDest shows, a value of pDest is incremented by 1, and processing is returned to the step S2423 (step S2426). As a result of repeating the processing in the above-mentioned steps S2423 to S2426 by the number of symbols included in the column k, the compression process of the column k is finished when a value of the variable n is equal to the size of the column k.

The compressed data 500 shown in FIG. 6 is generated by the operation of the block data compression unit 220 and the columnar data compression unit 24 respectively described referring to FIGS. 11 to 13. The compressed data 500 generated as described above is copied in the storage medium 150 of the columnar data decompression device 100 and is used by application software.

FIG. 14 shows an example of a data acquisition request requested from the application execution unit 110 to the block data decompression unit 120 in Example 1. This example shows circumstances in which data of 100 KB starting from an address 0x00010000 is referred. The operation for this request of the columnar data decompression device 100 will be described below.

Figure 15:
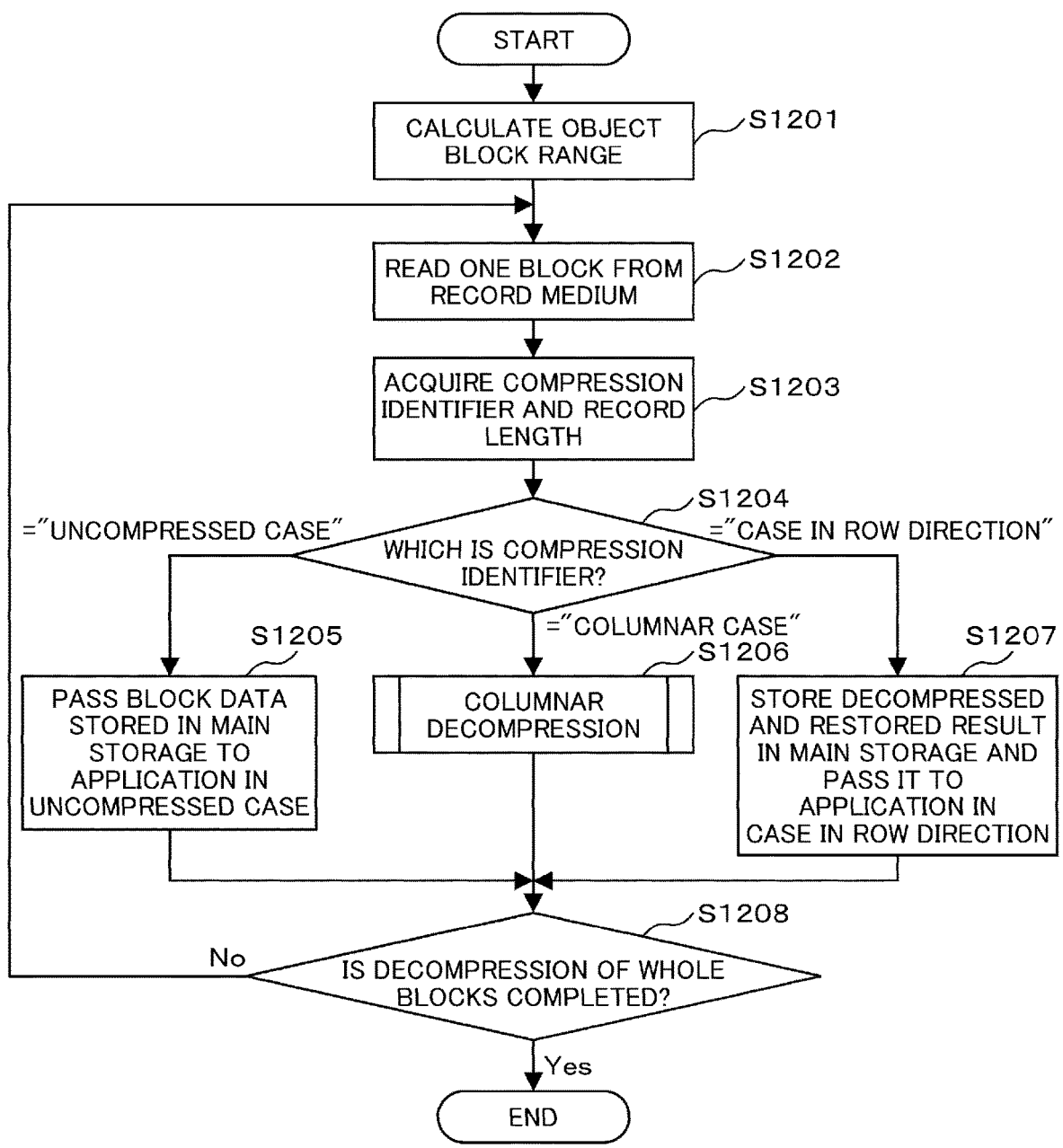
FIG. 15 is a flowchart showing the operation of a block data decompression unit (Example 1)

FIG. 15 is a flowchart showing the operation of the block data decompression unit 120 when the block data decompression unit receives the data acquisition request from the application execution unit 110. The block data decompression unit 120 first calculates a range of an object block based upon a requested address and requested size (step S1201). In the case of the request shown in FIG. 14, blocks 2, 3 which are blocks including 100 KB starting from the address 0x00010000 are the range of the object block.

Next, compressed data for one block in the range of the object blocks is read from the storage medium 150 and is stored in the main storage 160 (step S1202). This processing is performed by reading from a start address 0x00001520 of the block 2 to which the index data 501 points to an ending address 0x00005043 (a value acquired by subtracting 1 from a start address of the next block 3) of the block 2.

Next, a compression identifier and record length are acquired from the head of the read block (step S1203).

Next, processing is branched according to the acquired compression identifier (step S1204). When the compression identifier is 00 (uncompressed), the block data stored in the main storage 160 is passed to application software as it is (step S1205). When the compression identifier is 01 (columnar compression), a columnar decompression process is performed for the block data stored in the main storage 160

(step S1206). The details of the columnar decompression process will be described later.

When the compression identifier is 02 (compression in a row direction), a decompression process in a row direction is performed for the block data stored in the main storage 160 using well-known compression algorithm such as zlib, a decompressed and restored result is stored in the main storage 160, and the result is passed to the application software (step S1207).

After any of the above-mentioned three steps is executed, it is determined whether the decompression process of all the blocks included in the range of the object blocks is completed or not and when there is the undecompressed block, processing is returned to the step S1202 (step S1208).

Processing after return to S1202 is similar to the above-mentioned processing, as to data in the block 3, an address (0x00005044 to 0x00008212) in the storage medium of the block 3 is acquired based upon the contents of the index data 501, the data of the block 3 is read, and a decompression process is performed. When it is determined that the decompression of all the blocks is completed in the step S1208 as a result of repeating the above-mentioned process, the decompression process of the block data is finished.

Figure 16:
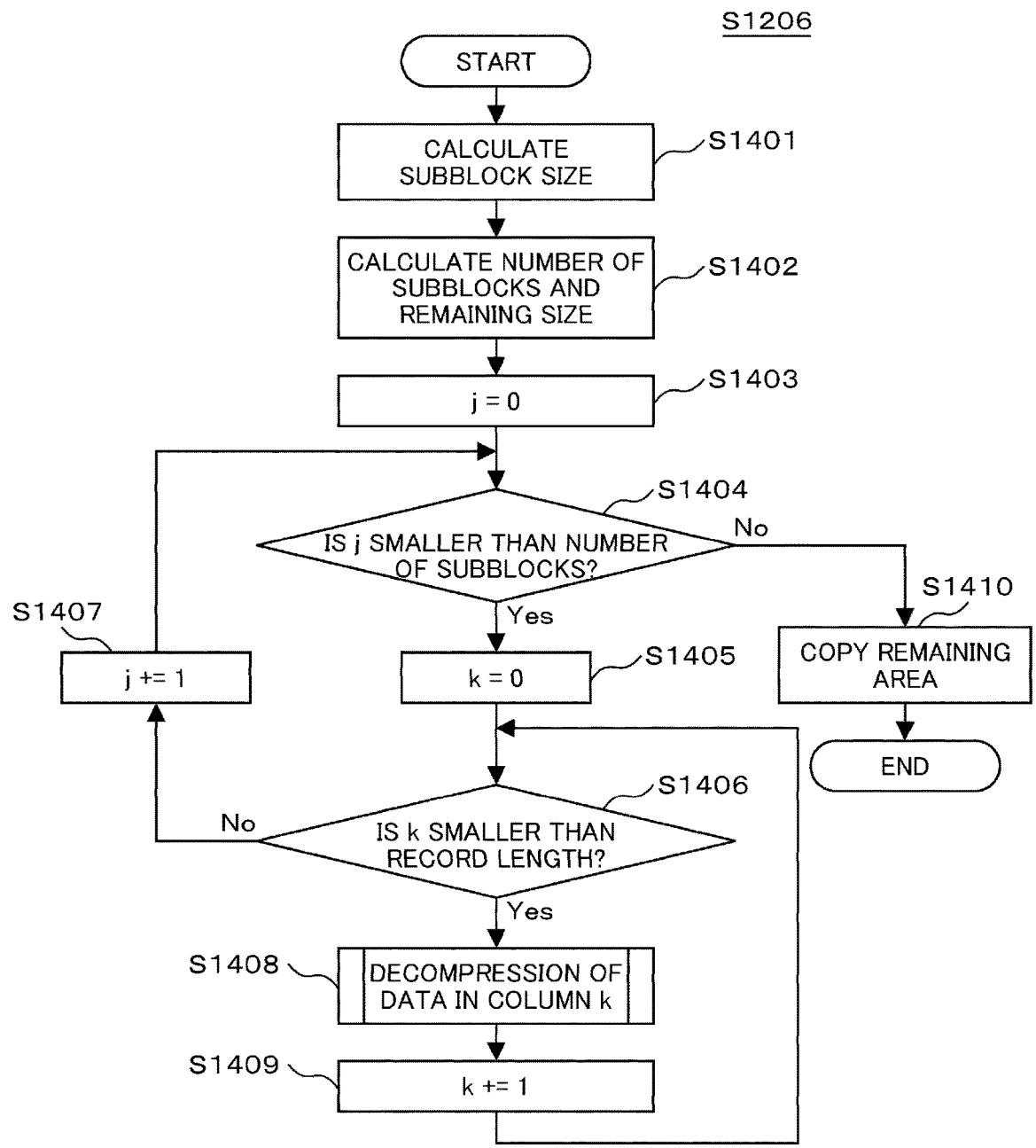
FIG. 16 is a flowchart showing the operation of a columnar data decompression unit (Example 1)

FIG. 16 is a flowchart showing the operation of the columnar data decompression unit 140 executed in the step S1206 shown in FIG. 15. The columnar data decompression unit 140 first calculates subblock size based upon the capacity of the cache memory 170 (step S1401). This calculation is performed according to the same calculation formula as in the calculation of subblock size in the columnar data compression device 200. That is, assuming that a half (16 KB) of 32 KB can be used for holding data after decompression when the capacity of the cache memory is 32 KB and the size of one record is 12 bytes, the size (16380 bytes) of the maximum number of records which can be stored in 16 KB is equivalent to subblock size.

Next, the number of subblocks included in the block during processing and the size of the remainder are calculated (step S1402). This calculation is also same as the calculation of the number of subblocks in the columnar data compression device 200, the number of subblocks is 4, and the size of the remainder is 16 bytes.

Next, the variable j of the counter in the loop process repeated for each subblock is initialized to zero (step S1403).

Next, it is determined whether the variable j is below the number of subblocks or not (step S1404). When the variable j is below the number of subblocks, the variable k of the counter in a loop process repeated for each column is initialized to zero (step S1405).

Next, it is determined whether the variable k is below record length or not (step S1406). When the variable k is below record length, data in a column k is decompressed (step S1408). Details of the decompression process in the column k will be described later.

Next, the variable k of the counter is incremented by 1 and processing is returned to the step S1406 (step S1409). When the variable k becomes equal to record length as a result of repeating the processing described in the steps S1406 to S1409 for each column, the variable j of the counter is incremented by 1 and processing is returned to the step S1404 (step S1407).

When a value of the variable j becomes equal to the number of subblocks as a result of repeating the above-mentioned processing for each subblock, a remaining area is returned to application software as it is (step S1410).

Figure 17:
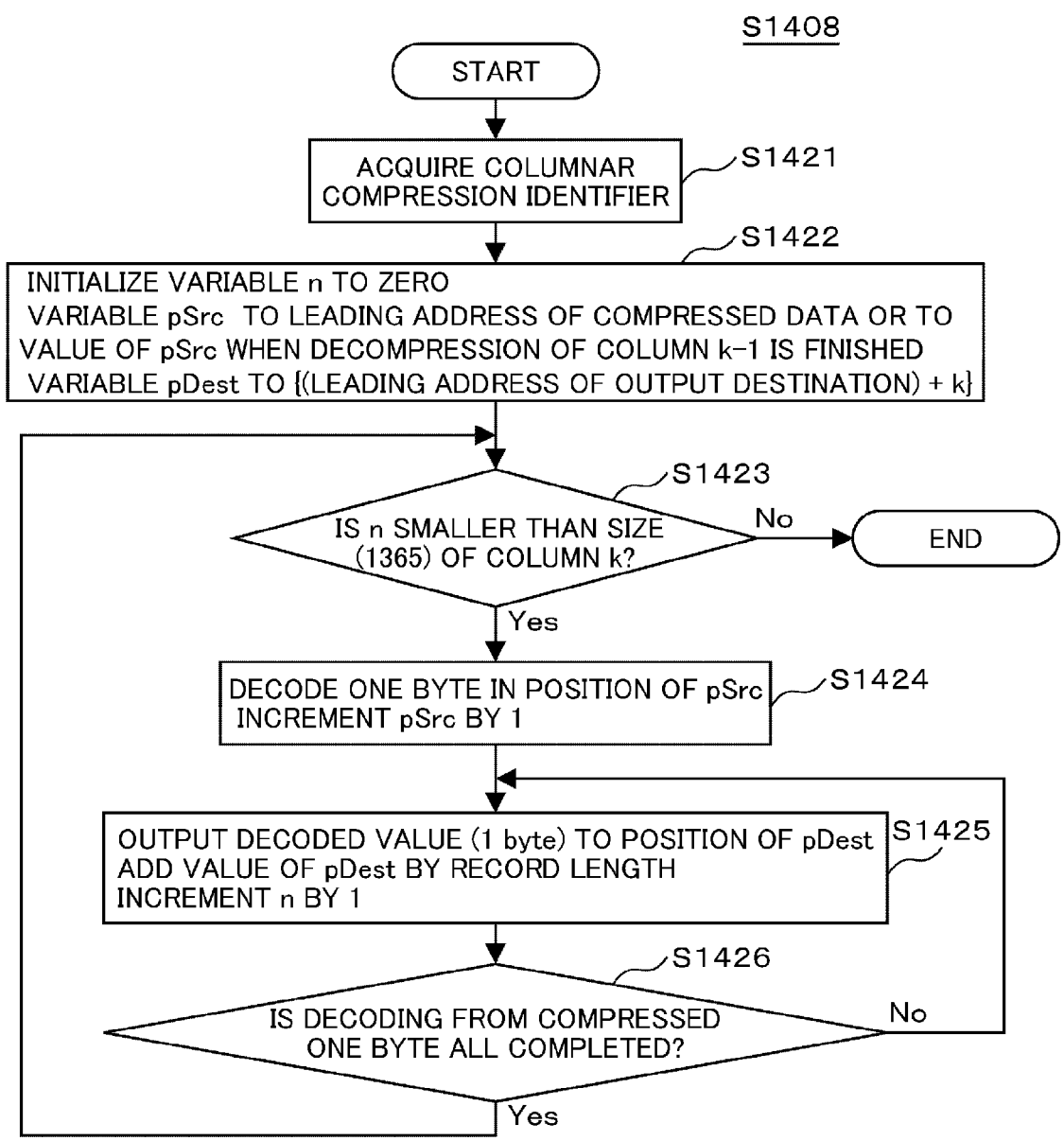
FIG. 17 is a flowchart showing the operation of a columnar decompression process (Example 1)

FIG. 17 is a flowchart showing a decompression process of data in the column k executed in the step S1408 shown in FIG. 16. First, a columnar compression identifier is acquired from the head of compressed data (step S1421).

Next, variables n, pSrc and pDest respectively used in the decompression process are initialized (step S1422). The variable n is a variable showing the size of output data (the number of bytes) and is initialized to zero. The variable pSrc is a variable showing an address at which compressed data is stored and is initialized to a leading address of the compressed data or a value of pSrc when the decompression of a column k−1 immediately before is finished. The variable pDest is initialized to "a leading address of an output destination of decompressed data+k (when the width of the column is 1 byte)" in the case of the column k.

Next, it is determined whether the variable is below the size (that is 1365) of the column k or not (step S1423).

When the variable n is below the size of the column k, one byte that exists at an address shown by the variable pSrc is decoded according to the method shown by the columnar compression identifier and the variable pSrc is incremented by 1 (step S1424).

Such processing that as data of one or more bytes is normally decoded based upon one byte, decoded one byte is output to a location shown by the variable pDest, a value of pDest is added by record length and the variable n is incremented by 1 is repeated (step S1425).

After the output of plural bytes decoded based upon one byte of compressed data is completed, processing is returned to the step S1423 (step S1426).

When a value of the variable n becomes equal to the size of the column k as a result of repeating the processing in the steps S1423 to S1426, the decompression process of the column k is finished.

According to the operation of the block data decompression unit 120 and the columnar data decompression unit 140 described referring to FIGS. 15 to 17, the compressed data located in a location requested from the application execution unit is decompressed.

Flows of the data compression process and the data decompression process in the tree data compression system in Example 1 have been described. FIG. 18 shows a state of the cache memory 170 in the decompression process of the compressed data in Example 1. A state in which records #1 to #1365 are stored in the cache memory 170 by referring to a column 00 is the same as the state shown in FIG. 5, however, as decompression processing of a column 01 is executed after the processing of the record #1365, the contents of entry 0 in the cache memory 170 is not replaced. That is, as unnecessary update of the cache memory 170 is inhibited in the execution of the process shown in FIGS. 16 and 17, compressed data can be decompressed at high speed.

Example 2

Referring to FIGS. 19 to 30, a running history data reading system in Example 2 will be described below. Example 2 enables collecting running history data of a car navigation system in a center system and referring to it from various terminals. A running history means data acquired by recording coordinates of a current location in the car navigation system every predetermined time such as one second and in addition to helping the confirmation of a situation when a problem occurs in the car navigation system, such service that a running path is superimposed on a map using a running history acquired by being uploaded on the center system by a user and it helps to make memories of a trip is also provided recently.

For a method of collecting running history data, a method of outputting running history data by connecting an external record medium such as an SD card to a car navigation system, a method of uploading on the center system via a communication network by connecting a communication device such as a cellular phone to the car navigation system, a method extracting running history data from the car navigation system using a maintenance terminal in a dealer and others are used, however, in this example, the method of collecting the running history in the center system is not especially described, and a method of distributing a compressed running history to various terminals on the premise that running histories are collected in the center system will be described below.

Example 2 will be described with difference from Example 1 in the center below. In Example 2, the columnar data decompression device 100 is equivalent to a terminal for reading a running history and the columnar data compression device 200 is equivalent to the center system that distributes a compressed running history.

Figure 19:
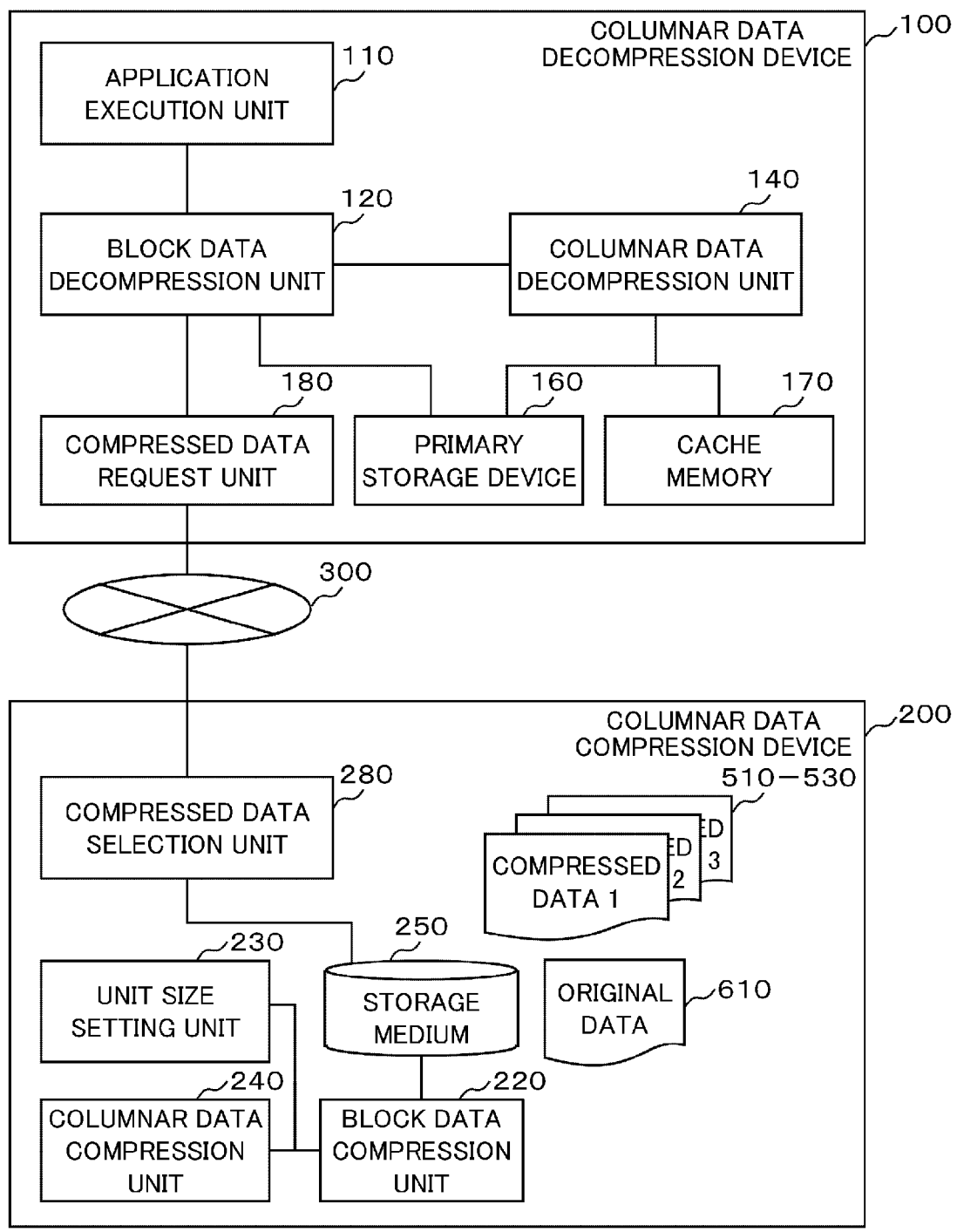
FIG. 19 shows the whole configuration of a running history data reading system (Example 2)

FIG. 19 shows the whole configuration of the running history data reading system in Example 2. The whole configuration in Example 2 is different from the whole configuration in Example 1 shown in FIG. 1 in that a compressed data request unit 180 and a compressed data selection unit 280 are added. Besides, plural compressed data 510 to 530 are stored in a storage medium 250. Moreover, the compression definition file 700 described in Example 1 does not exist. This reason is that it is supposed that running history data is configured by a fixed-length record of 8 bytes and a compression method is not required to be switched every block.

FIG. 20 shows a format of running history data and an example of data. One record of the running history data is configured by an x-coordinate (4 bytes) and a y-coordinate (4 bytes). The running history data is configured by a list of xy coordinates collected at a predetermined cycle while a vehicle is run and in FIG. 20, the arrangement of coordinates at 10 points is shown for example.

FIG. 21 shows an example in which a list of running history data included in original data 610 is noted by hexadecimal numbers and an example of compressed data of a column 00 included in compressed data 510. In the example of the running history data, to facilitate understanding, the running history data is described in a state in which a line is fed in units of 8 bytes which are the size of one record. Noteworthy contents in this case are that high order bytes substantially have small values such as 0 and 1 because a large numeric value that uses 4 bytes is seldom stored as to the x-coordinate and the y-coordinate. Accordingly, like the tree data described in Example 1, the enhancement of compressibility can be expected by compressing data in a columnar direction.

Figure 22:
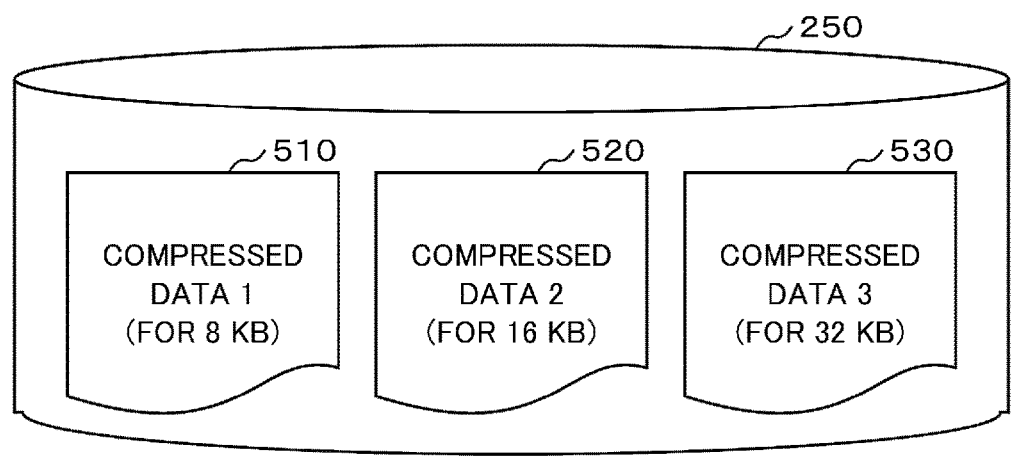
FIG. 22 shows the configuration of a storage medium (Example 2)

FIG. 22 shows the compressed data 510 to 530 stored in the storage medium 250. The compressed data 510 is stored for a columnar data decompression device having cache memory capacity of 8 KB, the compressed data 520 is stored for a columnar data decompression device having cache memory capacity of 16 KB, and the compressed data 530 is stored for a columnar data decompression device having cache memory capacity of 32 KB.

Figure 23:
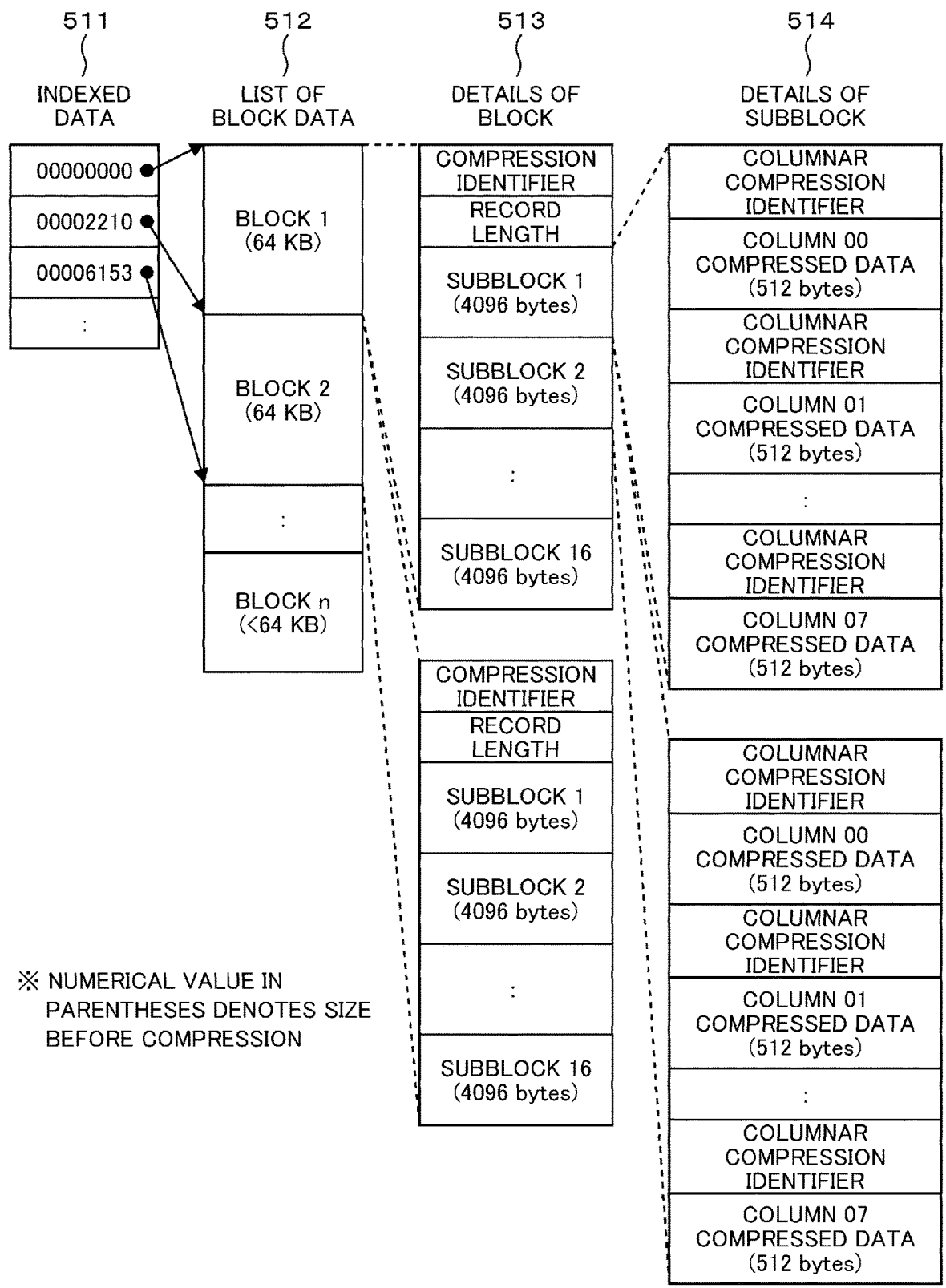
FIG. 23 shows the configuration of compressed data (for a cache of 8 KB)(Example 2)

FIG. 23 shows details of the compressed data 510 for the columnar data decompression device having the cache memory capacity of 8 KB (a numeric value in parentheses denotes size before compression). The number of records (size of one record: 8 bytes) that can be stored in 4 KB which is a half of 8 KB as the cache memory capacity is 512 and accordingly, the size of a subblock is 4096 bytes acquired by multiplying 512 records by 8 bytes. The size of each column included in the subblock is 512 bytes.

FIG. 24 shows details of the compressed data 520 for the columnar data decompression device having the cache memory capacity of 16 KB (a numeric value in parentheses denotes size before compression). The number of records (size of one record: 8 bytes) that can be stored in 8 KB which is a half of 16 KB as the cache memory capacity is 1024 and accordingly, the size of a subblock is 8192 bytes acquired by multiplying 1024 records by 8 bytes. The size of each column included in the subblock is 1024 bytes.

Figure 25:
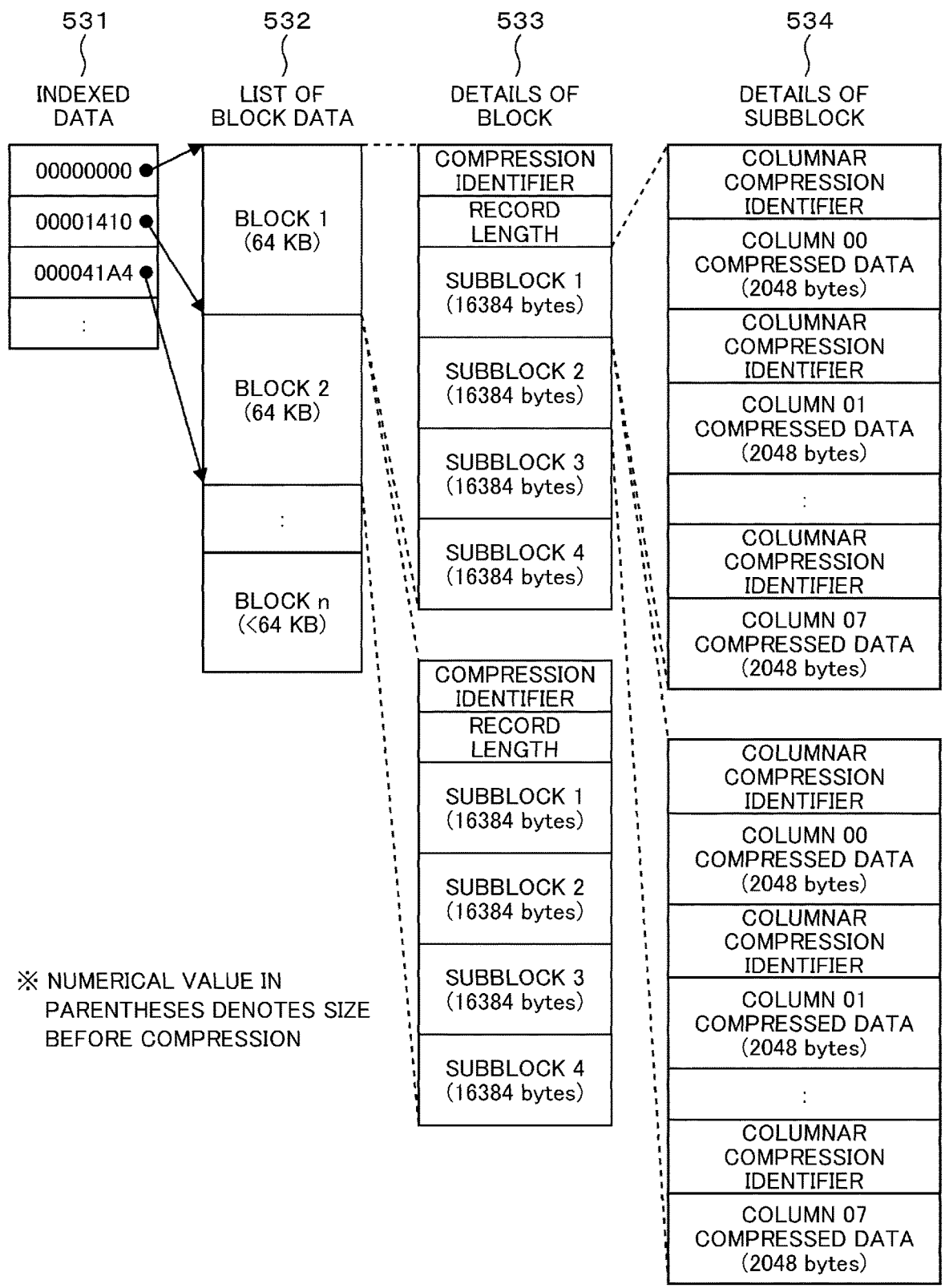
FIG. 25 shows the configuration of compressed data (for a cache of 32 KB)(Example 2)

FIG. 25 shows details of the compressed data 530 for the columnar data decompression device having the cache memory capacity of 32 KB (a numeric value in parentheses denotes size before compression). The number of records (size of one record: 8 bytes) that can be stored in 16 KB which is a half of 32 KB as the cache memory capacity is 2048 and accordingly, the size of a subblock is 16384 bytes acquired by multiplying 2048 records by 8 bytes. The size of each column included in the subblock is 2048 bytes.

As for the compressed data 510 to 530, the cache memory capacity is a multiple of record size, the remaining area that exists in FIG. 6 does not exist.

Example 2 will be described according to a flow in which running history data is distributed below.

Figure 26:
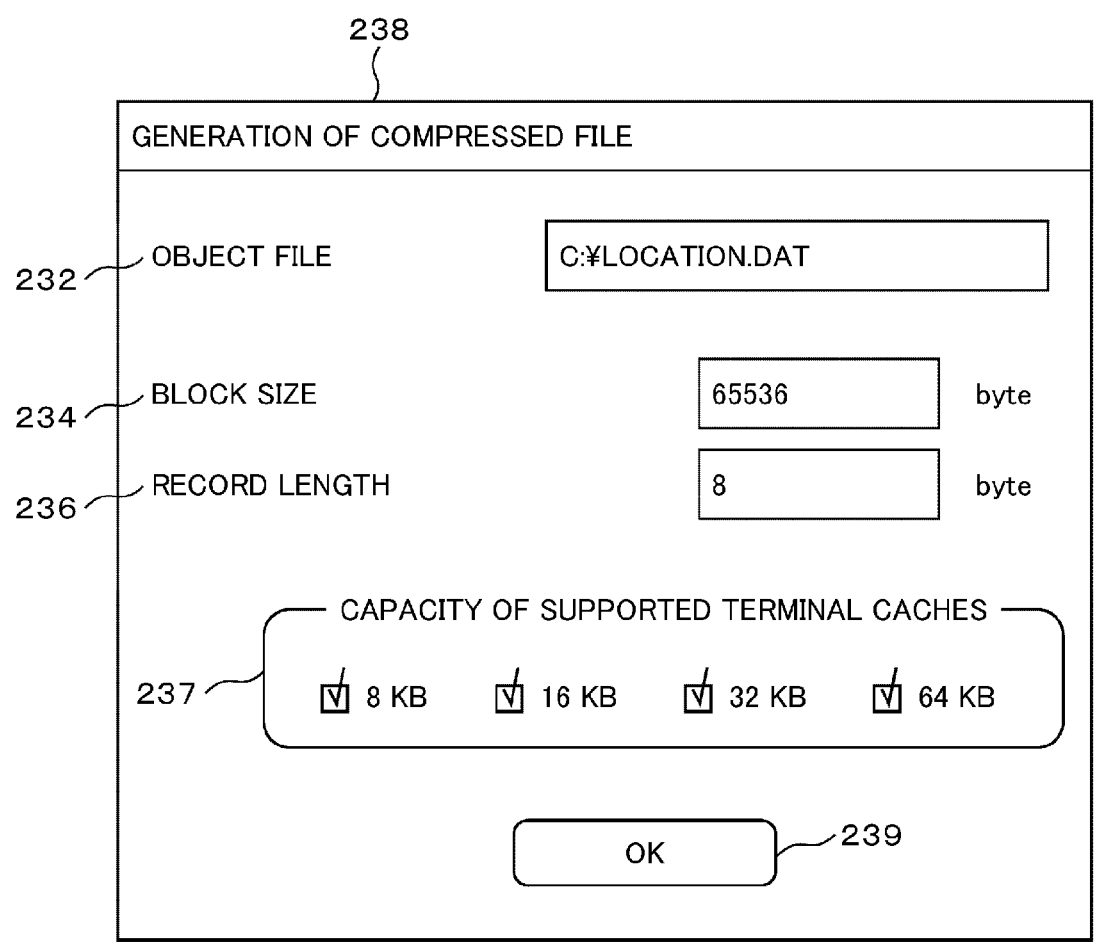
FIG. 26 shows a compressed data generation screen (Example 2)
Figure 27:
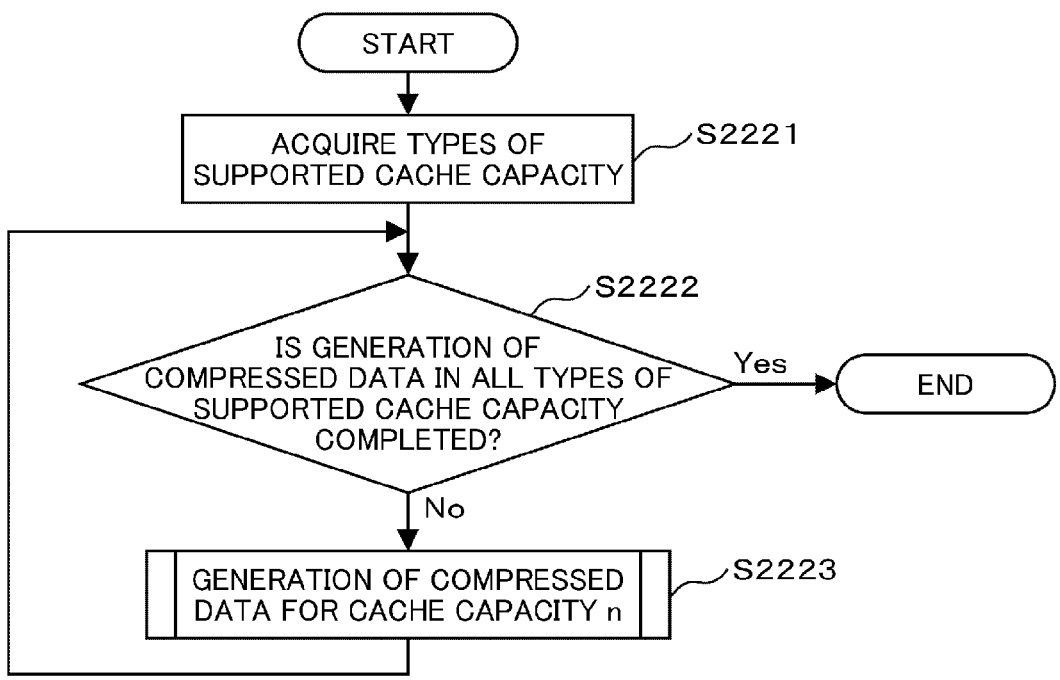
FIG. 27 is a flowchart showing the operation of a block data compression unit (Example 2)

FIG. 26 shows a unit size setting screen 238 displayed by a unit size setting unit 230 when running history data is compressed using a columnar data compression device 200. The unit size setting screen 238 includes fields for inputting an object file 232 and block size 234 as in Example 1. Example 2 is different from Example 1 in that a button 237 for specifying record length 236 and supported cache memory capacity is added and no field for inputting the compression definition file 700 exists. The button 237 for specifying supported cache memory capacity specifies cache memory capacity of the columnar data decompression device that reads running history data and in an example, setting for generating compressed data for plural terminals provided with each cache memory 170 of 8 KB, 16 KB and 32 KB is shown. FIG. 27 is a flowchart showing the operation of a block data compression unit 220 after an OK button 239 is pressed on the unit size setting screen 238. The block data compression unit 220 first acquires a type of supported cache memory capacity input on the unit size setting screen 238 (step S2221).

Next, it is determined whether all compressed data for the specified type of cache memory capacity is generated or not (step S2222) and when the generation is not completed, ungenerated compressed data is generated (step S2223). A flow of generating the compressed data executed in the step S2223 is the same as the contents shown in FIG. 11 in Example 1.

According to the above-mentioned operation, compressed data for each columnar data decompression device different in the capacity of the cache memory 170 is generated.

Figure 28:
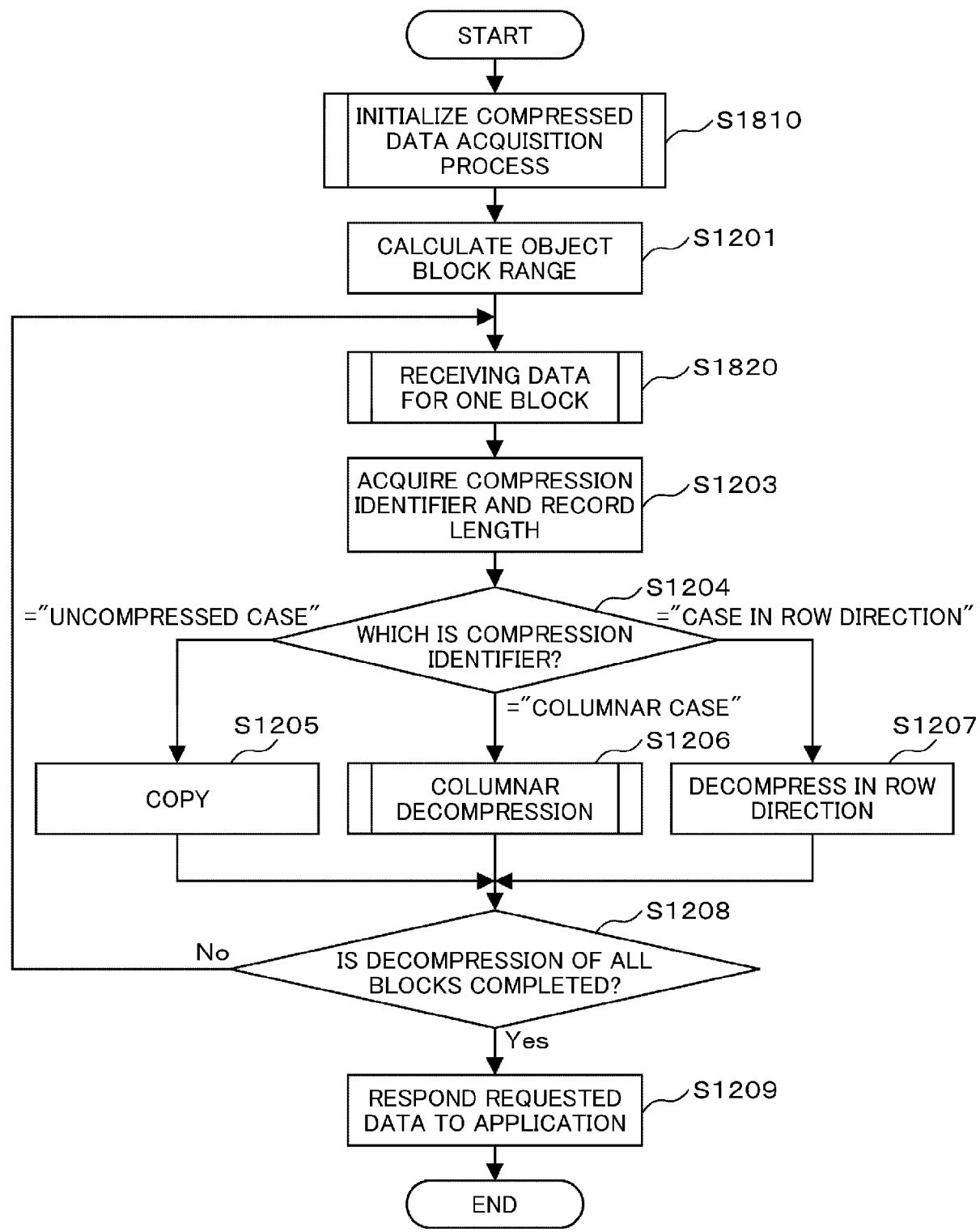
FIG. 28 is a flowchart showing a compressed data generation process for each unit (Example 2)

FIG. 28 is a flowchart showing the operation of a block data decompression unit 120 when data is requested from an application execution unit 110. FIG. 28 is substantially similar to FIG. 15 in Example 1, however, FIG. 28 is different from FIG. 15 in that compressed data acquisition processing is initialized before the start of a series of processing (step S1810) and processing for acquiring data for one block is performed via a communication network (step S1820).

Figure 29:
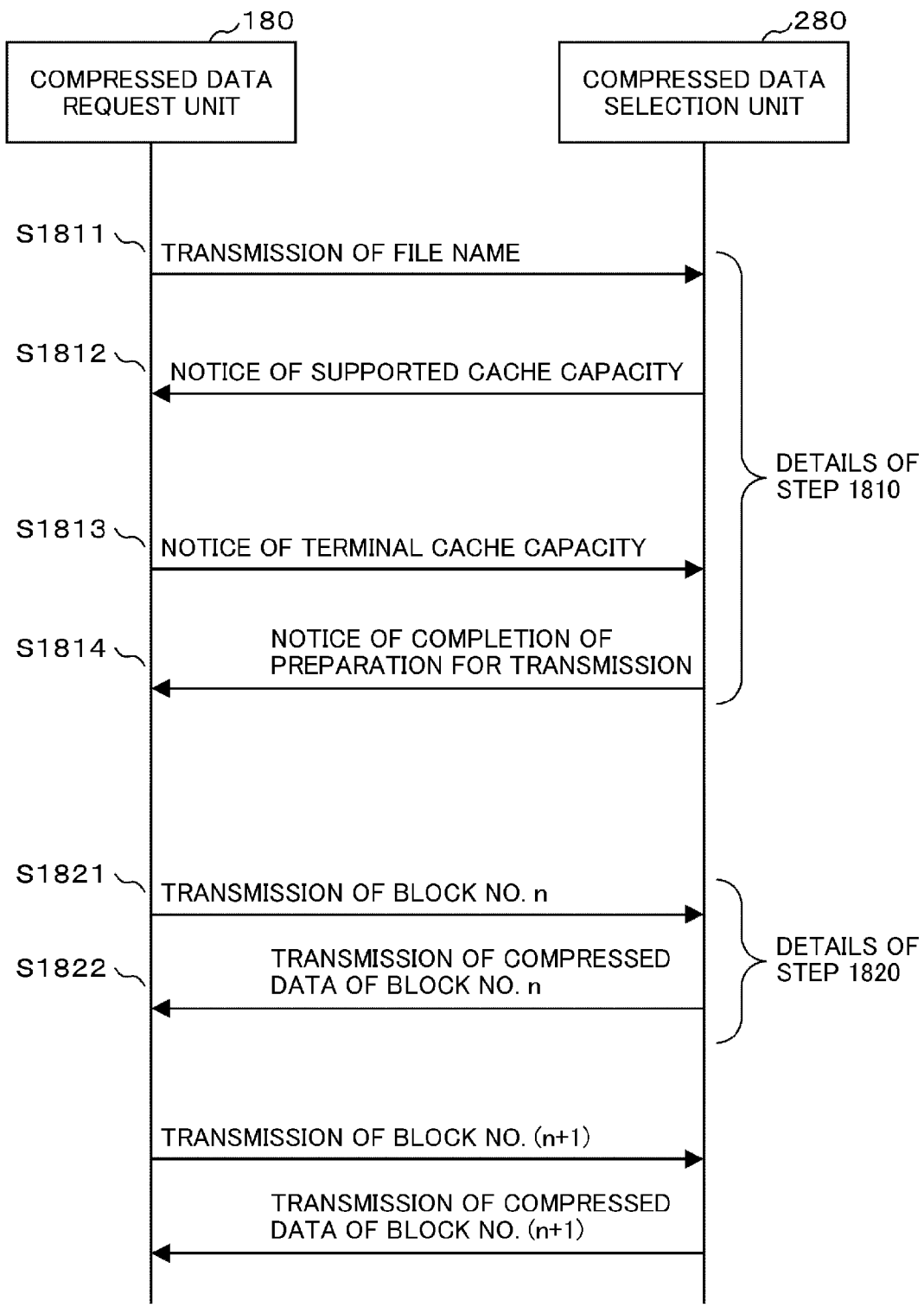
FIG. 29 shows a compressed data transmission/reception sequence (Example 2)

FIG. 29 shows a flow of the initialization of the compressed data acquisition processing and the processing for receiving data for one block respectively executed in the steps S1810 and S1820 shown in FIG. 28 and respectively between the compressed data request unit 180 and the compressed data selection unit 280. In the step S1810, first, a name of an object file is transmitted from the compressed data request unit 180 to the compressed data selection unit 280 (step S1811). In response to this, supported cache memory capacity in relation to the object file is notified from the compressed data selection unit 280 to the compressed data request unit 180 (step S1812). In the case of Example 2, it is notified that compressed data related to the object file for the columnar data decompression device provided with the cache memory capacity of any of 8 KB, 16 KB and 32 KB can be transmitted. In response to this, the capacity of the cache memory 170 is notified from the compressed data request unit 180 to the compressed data selection unit 280 (step S1813). In response to this, it is notified from the compressed data selection unit 280 to the compressed data request unit 180 that the specified compressed data is in a transmittable condition (step S1814).

Figure 30:
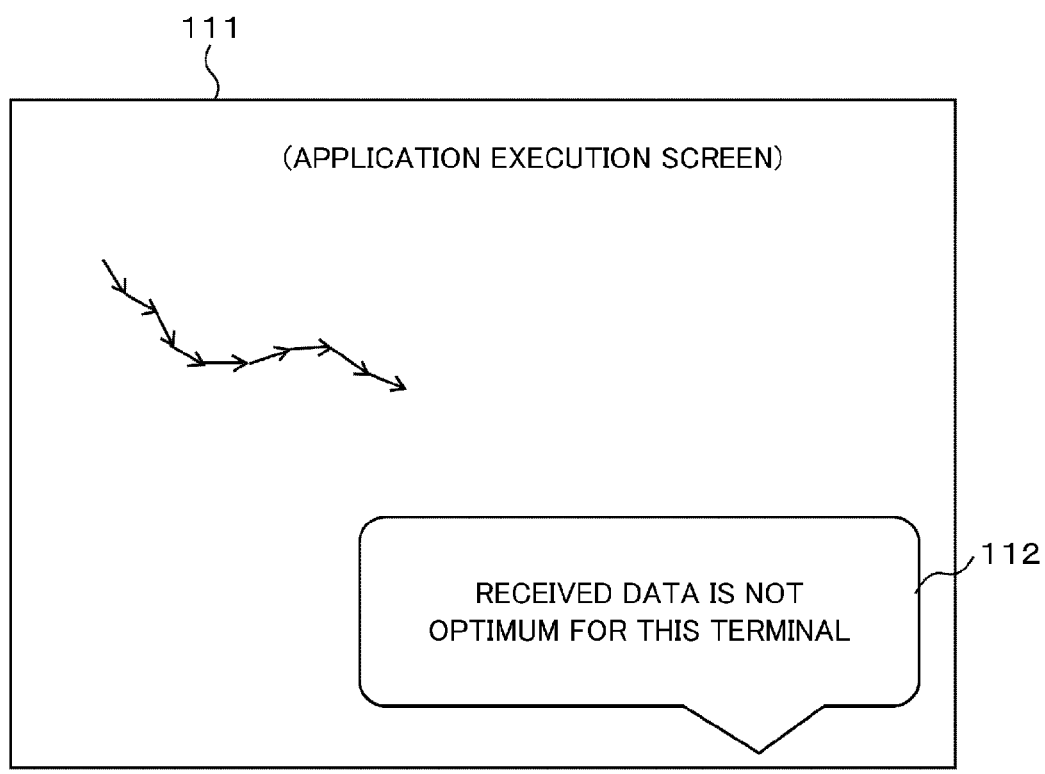
FIG. 30 shows a warning screen (Example 2)

When the cache memory capacity notified from the compressed data selection unit 280 in the step S1812 is not coincident with the capacity of the cache memory 170, the compressed data request unit 180 displays warning. FIG. 30 shows an example of an application execution screen 111 for displaying this warning and shows a message 112 for telling a user that received compressed data is not optimum for the columnar data decompression device. In Example 2, as a decompression process itself can be also continued in such a case though performance for decompression is deteriorated, the compressed data request unit 180 supposes that the process is continued as it is, however, the process may be also stopped.

A step S1821 and the following step shown in FIG. 29 show a flow of transmitting/receiving compressed data for one block in the step S1820 shown in FIG. 28 and first, a number of a required block is transmitted from the compressed data request unit 180 to the compressed data selection unit 280 (step S1821). In response to this, compressed data of the block corresponding to the specified block number is transmitted from the compressed data selection unit 280 to the compressed data request unit 180 (step S1822). The compressed data request unit 180 passes the received block to the block data decompression unit 120, a decompression process is performed according to the similar procedure to that in Example 1 there, and the block data decompression unit passes decompressed data to application software. The similar processing is also applied to the following block.

The flow of the data compression process and the data decompression process in the running history data reading system in Example 2 has been described. Compressed data which can be read at the highest speed can be provided to each terminal by preparing plural compressed data for various terminals different in performance beforehand as described above.

Example 3

Figure 31:
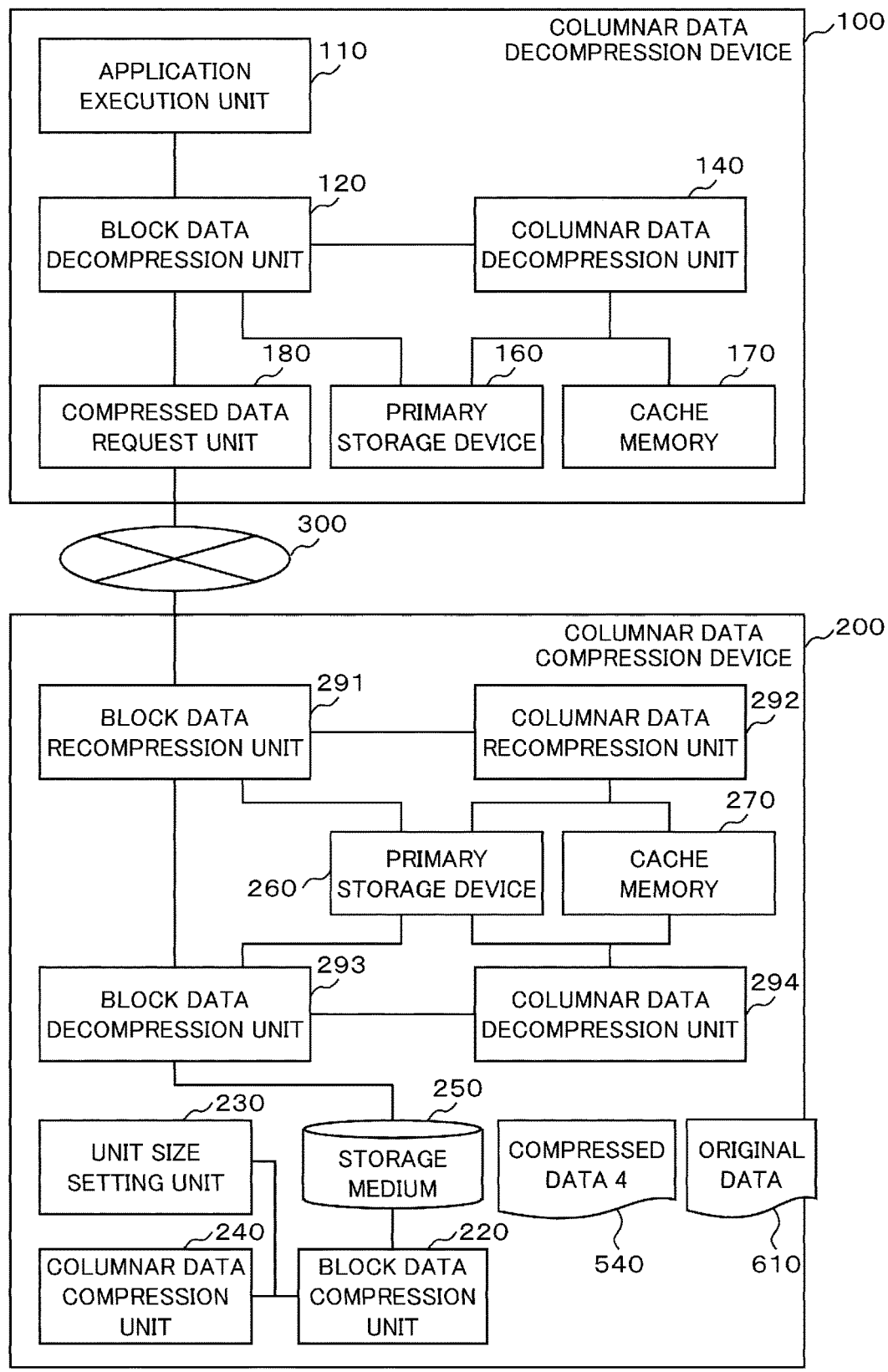
FIG. 31 shows the whole configuration of a running history data reading system in another embodiment (Example 3).

Referring to FIG. 31, a running history data reading system in an embodiment different from Example 2 will be described below.

FIG. 31 shows the whole configuration of the running history data reading system in Example 3. The whole configuration in Example 3 is different from the whole configuration in Example 2 shown in FIG. 19 in that a block data recompression unit 291, a columnar data recompression unit 292, a block data decompression unit 293, a columnar data decompression unit 294, a main storage 260 and a cache memory 270 are added. Moreover, compressed data stored in a storage medium 250 is one of compressed data 540. Besides, no compressed data selection unit 280 exists.

Example 3 will be described with a flow of a process when running history data is compressed and distributed in the center below.

The process for compressing running history data in Example 3 is basically similar to that in Example 2. However, generated compressed data is one of compressed data 540 and this data is compressed data for which the cache memory 270 provided to a columnar data compression device 200 can fulfill the highest decompression performance. That is, if the capacity of the cache memory 270 is 32 KB, the contents of the compressed data 540 are similar to the compressed data shown in FIG. 25.

Besides, a communication sequence between the columnar data compression device 200 and a columnar data decompression device 100 is also similar to that shown in FIG. 29 in Example 2. However, in the columnar data compression device 200 in Example 3, it is first checked in response to a request from the columnar data decompression device 100 whether the capacity of a cache memory 170 in the columnar data decompression device 100 is coincident with the capacity of the cache memory 270 or not.

When each capacity is coincident, the compressed data 540 is transmitted, when each capacity is not coincident, the compressed data 540 is decompressed in the block data decompression unit 293 and the columnar data decompression unit 294, next, the data is recompressed and transmitted according to the contents of the request from the columnar data decompression device 100 in the block data recompression unit 291 and the columnar data recompression unit 292.

The operation of the block data decompression unit 293 is similar to the block data decompression process in the columnar data decompression device 100 shown in FIG. 15 and the operation of the columnar data decompression unit 294 is similar to the columnar data decompression process in the columnar data decompression device 100 shown in FIG. 16. The operation of the block data recompression unit 291 is similar to the block data compression process shown in FIG. 11 and the operation of the columnar data recompression unit 292 is similar to the columnar data compression process shown in FIG. 12.

According to the above-mentioned configuration, in Example 3, such plural compressed data as in Example 2 are not required to be held and single compressed data has only to be held.

As processing for decompressing compressed data by 1 to 1 and recompressing it is added in the case of such configuration, processing time in the columnar data compression device 200 increases, however, to reduce this time, processing for decompression and compression in the columnar data decompression unit 294 and the columnar data recompression unit 292 may be also executed in parallel every column using plural processors.

REFERENCE SINGS LIST

100: Columnar data decompression device,
110: Application execution unit,

120: Block data decompression unit (Columnar data decompression device),
140: Columnar data decompression unit (Columnar data decompression device),
150: Storage medium (Columnar data decompression device),
160: Main storage (Columnar data decompression device),
170: Cache memory (Columnar data decompression device),
180: Compressed data request unit,
200: Columnar data compression device,
220: Block data compression unit,
230: Unit size setting unit,
240: Columnar data compression unit,
250: Storage medium (Columnar data compression device),
260: Main storage (Columnar data compression device),
270: Cache memory (Columnar data compression device),
280: Compressed data selection unit,
291: Block data recompression unit,
292: Columnar data recompression unit,
293: Block data decompression unit (Columnar data compression device),
294: Columnar data decompression unit (Columnar data compression device),
300: Communication network,
500: Compressed data (Example 1),
510: Compressed data (Example 2, for 8 KB cache),
520: Compressed data (Example 2, for 16 KB cache),
530: Compressed data (Example 2, for 32 KB cache),
540: Compressed data (Example 3),
600: Original data (Example 1),
610: Original data (Example 2 and Example 3),
700: Compression definition file.

The invention claimed is:

1. A data decompression device that decompresses compressed data including a plurality of compressed fixed-length records, comprising:
a processor; and
a memory coupled to the processor;
wherein the compressed data includes a result acquired by dividing compression object data in units of a compression object block size and compressing the compression object data of each of a plurality of compression object blocks;
wherein the compression object block size is determined based upon a size of one of the plurality of compressed fixed-length records and specification information of the data decompression device, where
the specification information of the data decompression device includes a capacity of a cache memory of the data decompression device or a capacity of a main storage the data decompression device uses, and
the cache memory or the main storage is controlled not to replace contents therein during a decompression process of all columns of compressed columnar data of the plurality of compressed fixed-length records included in one compression object block;
wherein one or more compression object blocks are acquired based upon the compressed data; and
wherein the processor is programmed to decompress each of a plurality of columns of compressed columnar data of the plurality of compressed fixed-length records included in the one or more compression object blocks and restore the plurality of compressed fixed-length records.

2. The data decompression device according to claim 1, wherein:
each of the plurality of compression object blocks includes one or more subblocks; and
the processor is programmed to control the decompression of each of the plurality of compression object blocks including data requested.

3. The data decompression device according to claim 1, wherein:
the specification information of the data decompression device includes the capacity of the cache memory of the data decompression device; and
the compression object block size is a maximum multiple of the size of the fixed-length record which does not exceed a value acquired by multiplying the capacity of the cache memory by predetermined ratio.

4. The data decompression device according to claim 3, wherein:
the predetermined ratio by which the capacity of the cache memory is multiplied is 0.5.

5. The data decompression device according to claim 1, wherein:
the specification information of the data decompression device includes the capacity of the main storage which the processor secures to hold decompressed data of the compression object block; and
the compression object block size is a maximum multiple of the size of the fixed-length record which does not exceed the capacity of the main storage.

6. The data decompression device according to claim 1, wherein:
the specification information of the data decompression device includes a capacity of a receiving data buffer included in a communication device provided to the data decompression device; and
the compression object block size is a maximum multiple of the size of the fixed-length record which does not exceed the capacity of the receiving data buffer.

7. The data decompression device according to claim 1, wherein:
the processor is programmed to transmit a name of compressed data and the specification information of the data decompression device to a data compression device via a communication network and receive the compressed data suitable for notified information from the data compression device.

8. The data decompression device according to claim 7, wherein:
the processor is programmed to output to a warning screen showing that no suitable compressed data exists when the processor is notified from the data compression device that no suitable compressed data exists.

9. A data compression device that compresses compression object data including a plurality of fixed-length records, comprising:
a processor; and
a memory coupled to the processor;
wherein the processor is programmed to receive an input of a size of one fixed-length record of the plurality of fixed-length records and specification information of a data decompression device, where
the specification information of the data decompression device includes a capacity of a cache memory of the data decompression device or a capacity of a main storage the data decompression device uses, and
the cache memory or the main storage is controlled not to replace contents therein during a decompression process of all columns of compressed columnar data of the plurality of compressed fixed-length records included in one compression object block; and determine a size of a compression object block based upon the size of the one fixed-length record and the specification information of the data decompression device, compress each of a plurality of columns of columnar data of the plurality of fixed-length records included in a plurality of compression object blocks, generate compressed columnar data and generate compressed data including the compressed columnar data.

10. The data compression device according to claim 9, wherein:

the specification information of the data decompression device includes the capacity of the cache memory of the data decompression device; and the size of the compression object block is a maximum multiple of the size of the fixed-length record which does not exceed a value acquired by multiplying the capacity of the cache memory of the decompression device by predetermined ratio.

11. The data compression device according to claim 10, wherein:

the predetermined ratio by which the capacity of the cache memory of the decompression device is multiplied is 0.5.

12. The data compression device according to claim 9, wherein the processor is programmed to:

divide the compression object data into blocks of predetermined size and control the compression of each block;

determine a method of compressing each block referring to a compression definition file in which a record length for each of corresponding portions of the compression object data with a fixed-length record is described; and compress the block by the determined compression method by the processor.

13. The data compression device according to claim 9, wherein:

a plurality of compressed data which the processor generates from one compression object data based upon a plurality of specification information input to the processor are stored in the memory; and the processor is programmed to receive the specification information of the data decompression device from the data decompression device via a communication network, select compressed data suitable for the received specification information, and transmit the compressed data to the data decompression device.

14. The data compression device according to claim 9, wherein the processor is programmed to receive the specification information of the data decompression device from the data decompression device via a communication network, and decompress compressed data when the specification information received via the communication network is different from specification information referred in generating the compressed data, wherein:

one compressed data generated based upon one compression object data is stored in the memory; and recompressed compressed data based upon the specification information of the data decompression device received from the data decompression device using decompressed data that is outputted from the processor for compression object data is transmitted to the data decompression device.

15. A non-transitory computer-readable medium including a program for making a computer function as an information processor that decompresses compressed data including a plurality of compressed fixed-length records, wherein:

the compressed data includes a result acquired by dividing compression object data in units of a compression object block size and compressing each of a plurality of compression object blocks; and the program makes the computer execute steps of:

determining the compression object block size of each of the plurality of the compression object blocks based upon a size of one of the plurality of compressed fixed-length records and specification information of the information processor, where the specification information of the information processor includes a capacity of a cache memory of the information processor or a capacity of a main storage the information processor uses, and the cache memory or the main storage is controlled not to replace contents therein during a decompression process of all columns of compressed columnar data of the plurality of compressed fixed-length records included in one compression object block;

acquiring one or more compression object blocks based upon the compressed data; and decompressing each of a plurality of columns of compressed columnar data of the plurality of compressed fixed-length records included in the compression object blocks and restoring the plurality of compressed fixed-length records.

16. A non-transitory computer-readable medium including a program for making a computer function as an information processor that compresses compression object data including a plurality of fixed-length records, wherein:

the computer is provided with an interface that accepts an instruction from a user; and the program makes the computer execute steps of:

accepting an input of a size of one fixed-length record and specification information of a data decompression device via the interface;

determining a size of a compression object block based upon the size of the fixed-length record and the specification information of the data decompression device, where the specification information of the data decompression device includes a capacity of a cache memory of the data decompression device or a capacity of a main storage the data decompression device uses, and the cache memory or the main storage is controlled not to replace contents therein during a decompression process of all columns of compressed columnar data of the plurality of compressed fixed-length records included in one compression object block;

dividing the compression object data into a plurality of compression object blocks;

compressing each of a plurality of columns of columnar data of the plurality of fixed-length records included in the plurality of compression object blocks and generating compressed columnar data; and generating compressed data including the compressed columnar data.

17. A compressed data distribution system in which a data compression device and a data decompression device are connected via a communication network, wherein:

the data compression device is provided with:

a processor; and a memory coupled to the processor;

wherein the processor is programmed to receive an input of a size of one fixed-length record of a plurality of fixed-length records and specification information of the data decompression device; and determine a size of a compression object block based upon the size of the fixed-length record and the specification information of the data decompression device, where the specification information of the data decompression device includes a capacity of a cache memory of the data decompression device or a capacity of a main storage the data decompression device uses, divide compression object data into a plurality of compression object blocks, compress each of a plurality of columns of columnar data of the plurality of fixed-length records included in each compression object block, generate compressed columnar data and generate compressed data including the compressed columnar data, and the cache memory or the main storage is controlled not to replace contents therein during a decompression process of all columns of compressed columnar data of the plurality of compressed fixed-length records included in one compression object block;

the compressed data includes a result acquired by dividing the compression object data in units of a compression object block size and compressing each of the plurality of compression object blocks; and the processor is programmed to determine the size of the compression object block based upon the size of the fixed-length record and the specification information of the data decompression device, acquire the plurality of compression object blocks based upon the compressed data, decompress each of a plurality of columns of compressed columnar data of the plurality of fixed-length records included in the compression object block and restore the plurality of fixed-length records.

* * * * *